(12) United States Patent
Yamamoto et al.

(10) Patent No.: US 7,485,918 B2
(45) Date of Patent: Feb. 3, 2009

(54) SEMICONDUCTOR DEVICE AND METHOD FOR MANUFACTURING THE SAME

(75) Inventors: Akihito Yamamoto, Naka-gun (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/797,670

(22) Filed: May 7, 2007

(65) Prior Publication Data

US 2007/0262372 A1    Nov. 15, 2007

(30) Foreign Application Priority Data

May 9, 2006    (JP) .............................. 2006-130340

(51) Int. Cl.
*H01L 29/788* (2006.01)
(52) U.S. Cl. ...................... 257/315; 438/257
(58) Field of Classification Search ................. 438/257, 438/258, 259, 261, 267, 296, 424; 257/315, 257/E27.103, E21.68, E29.129
See application file for complete search history.

(56) References Cited

U.S. PATENT DOCUMENTS 6,391,722 B1 *   5/2002   Koh ........................... 438/264
6,498,064 B2 *  12/2002   Tseng ......................... 438/257

FOREIGN PATENT DOCUMENTS

JP     11-204788     7/1999

* cited by examiner

*Primary Examiner*—David Vu
(74) *Attorney, Agent, or Firm*—Finnegan, Henderson, Farabow, Garrett & Dunner, L.L.P.

(57) ABSTRACT

A semiconductor device including a gate dielectric film provided on at least one site on a surface of a semiconductor substrate, at least one first gate electrode provided on the gate dielectric film, an inter-electrode dielectric film provided while covering a surface of the first gate electrode, at least partial film thickness of a portion covering a portion other than a corner portion that does not come into contact with the gate dielectric film from among a plurality of corner portions of the first gate electrode being formed to be smaller than at least partial film thickness of a portion covering the corner portion that does not come into contact with the gate dielectric film, and a second gate electrode provided while covering a surface of the inter-electrode dielectric film.

20 Claims, 22 Drawing Sheets

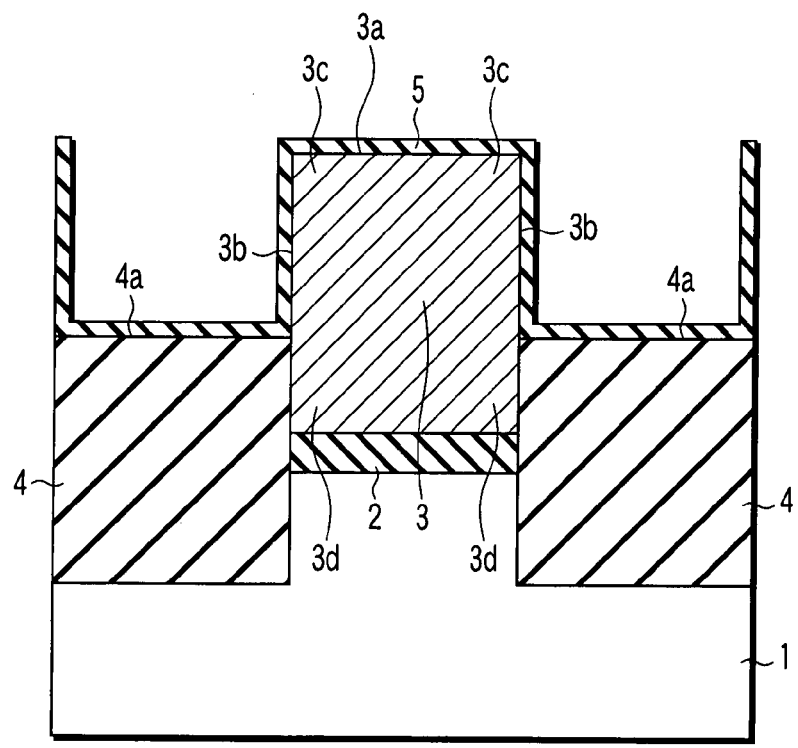
F I G. 1A
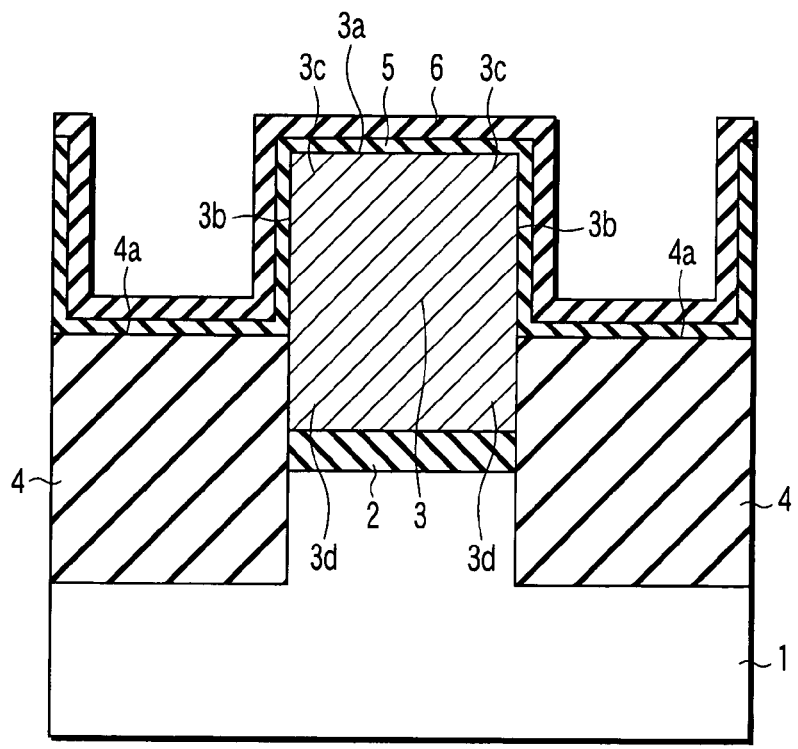
F I G. 1B

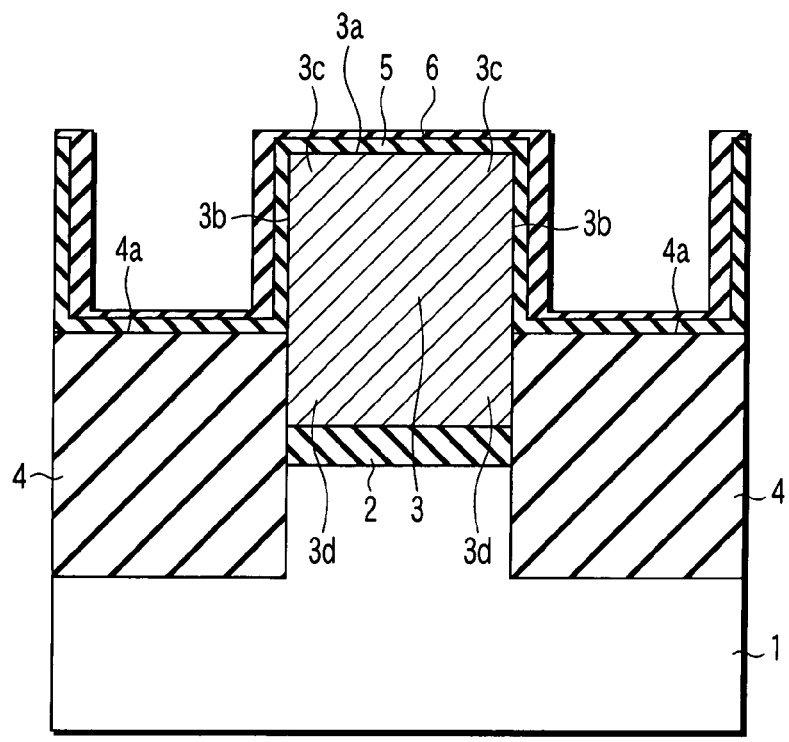
F I G. 2A
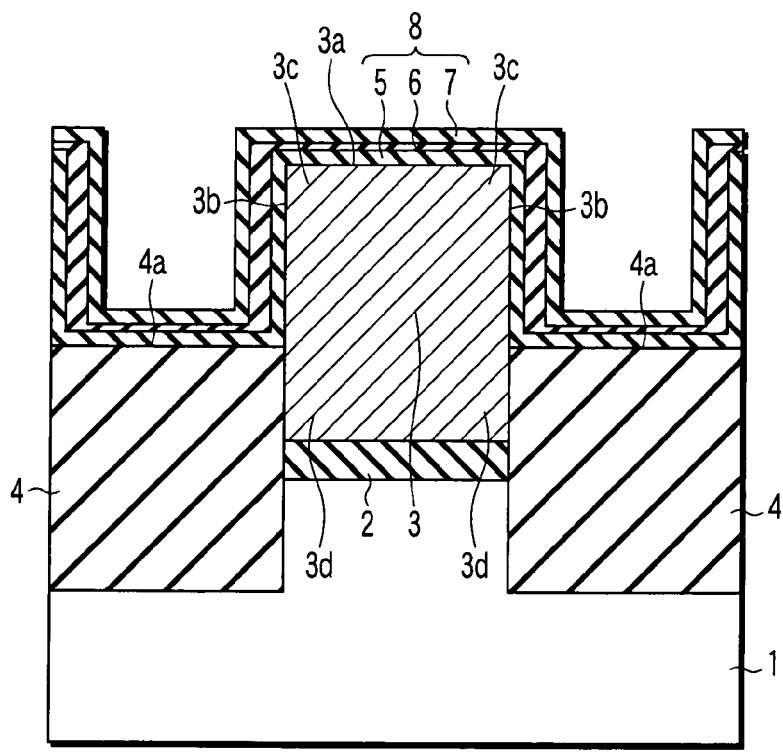
F I G. 2B

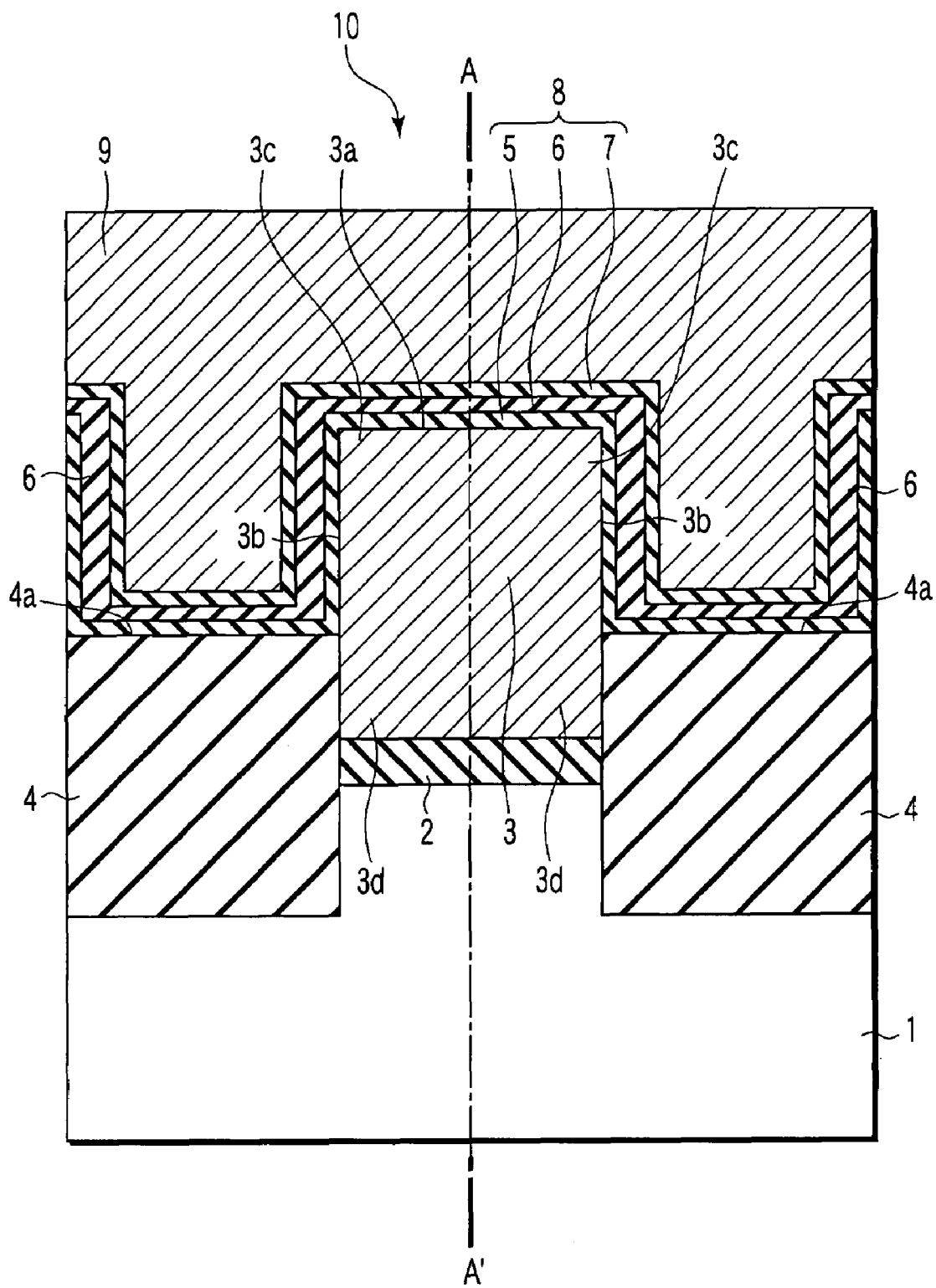
F I G. 3

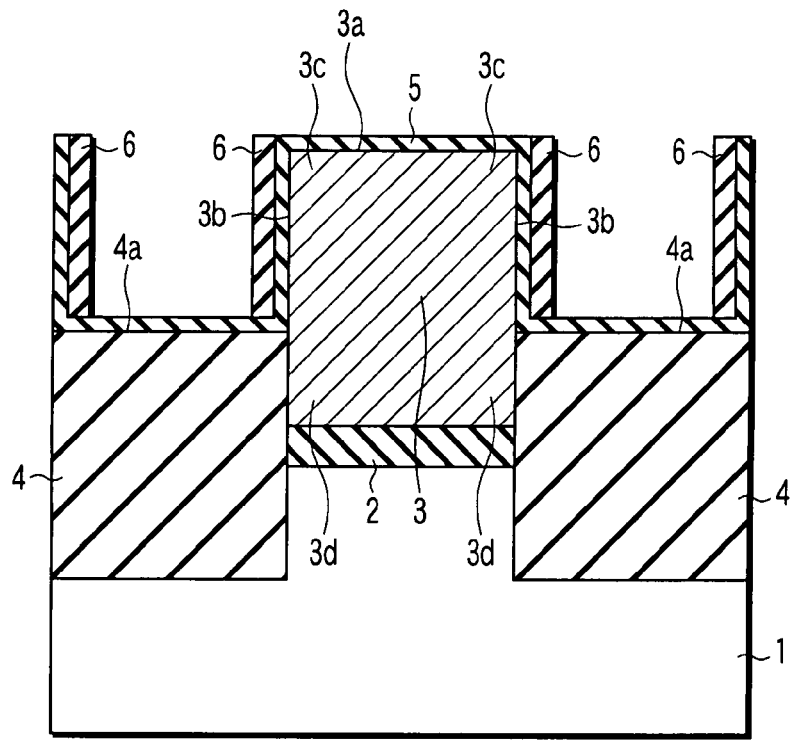
F I G. 5A
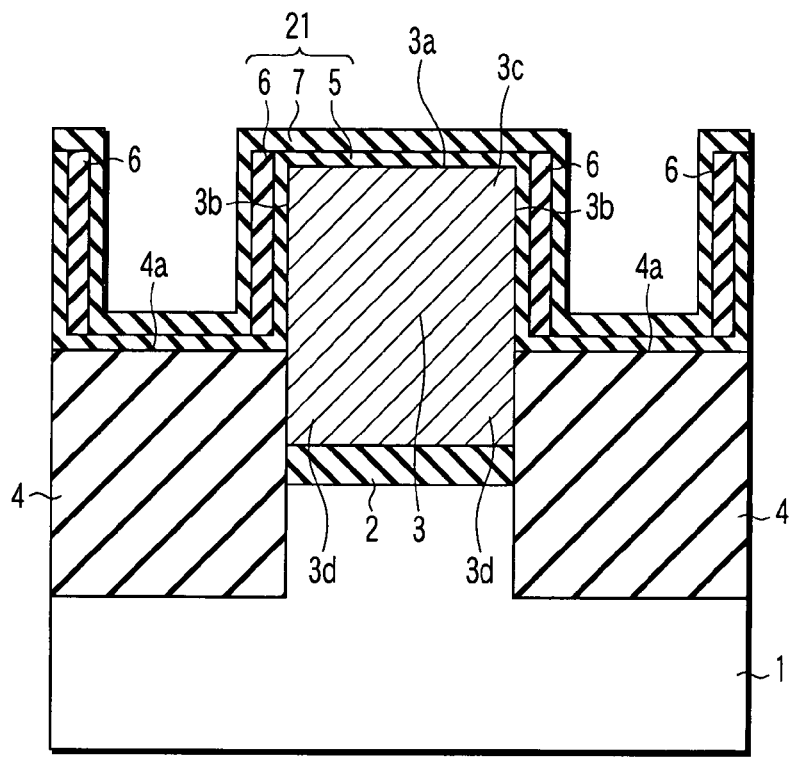
F I G. 5B

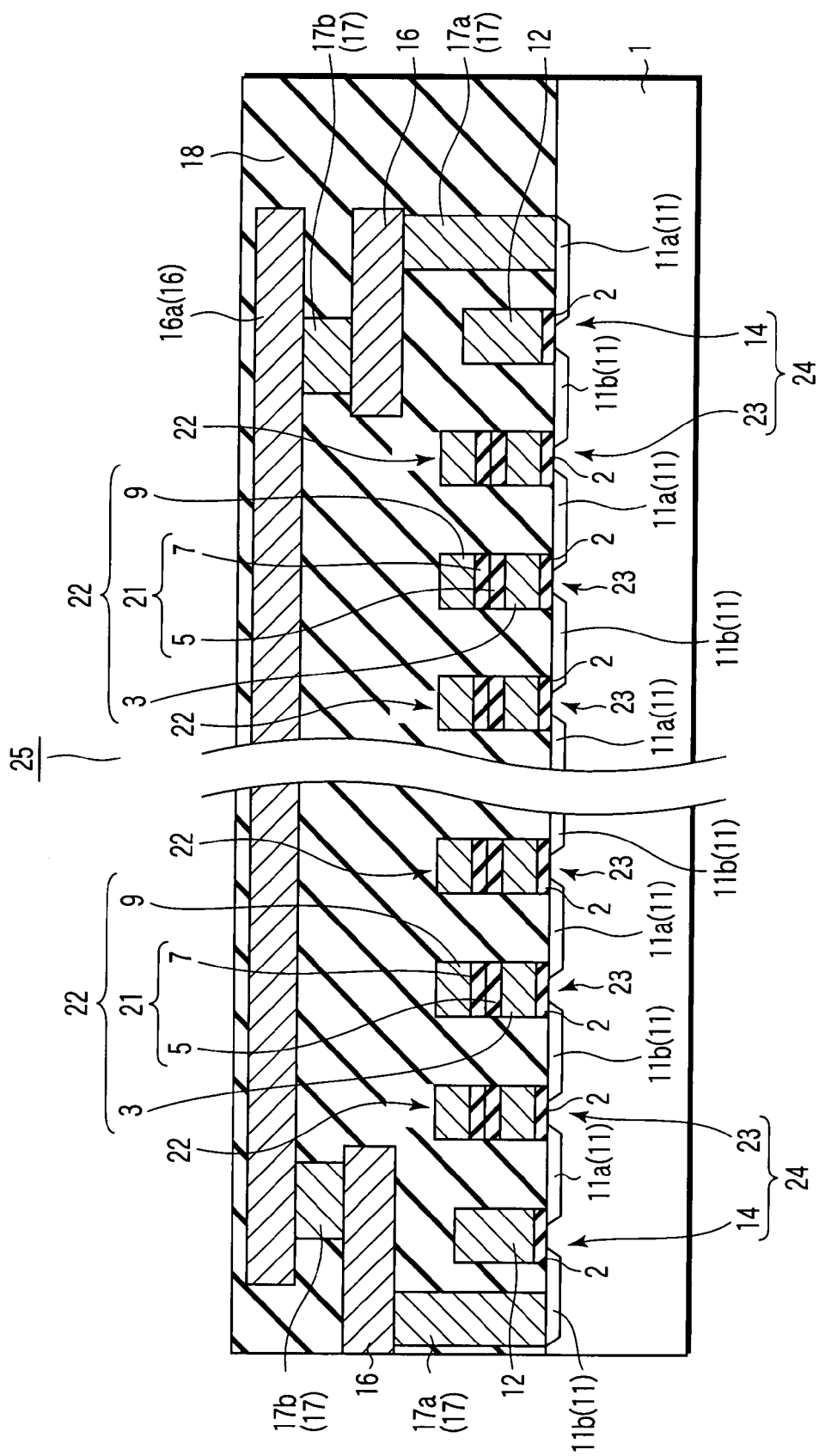

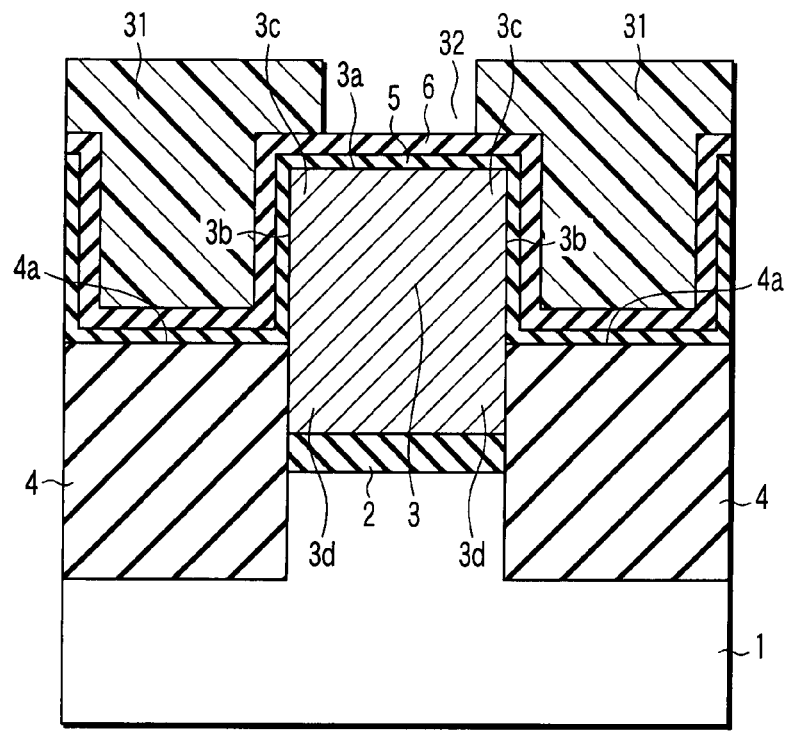
F I G. 8A
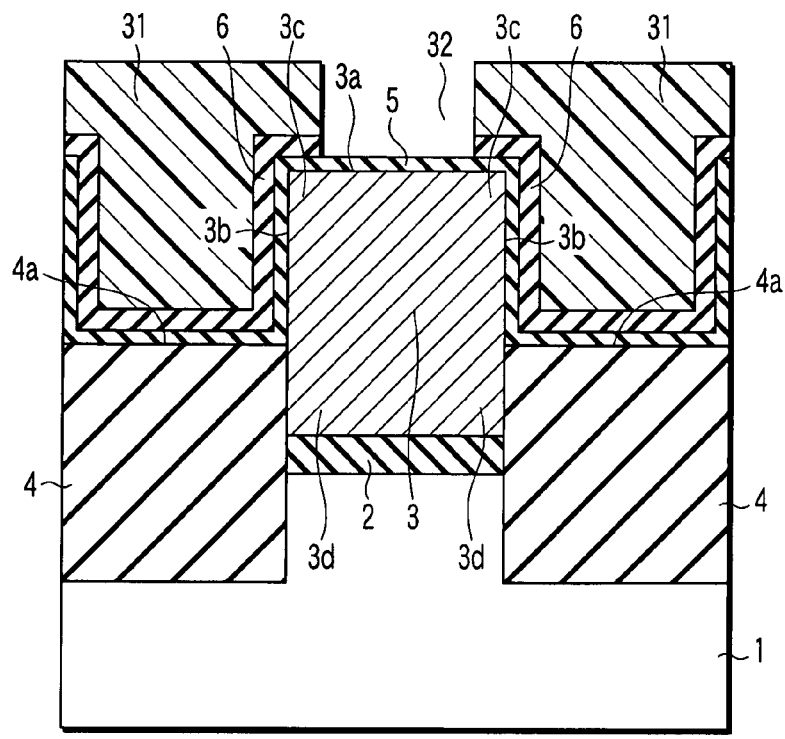
F I G. 8B

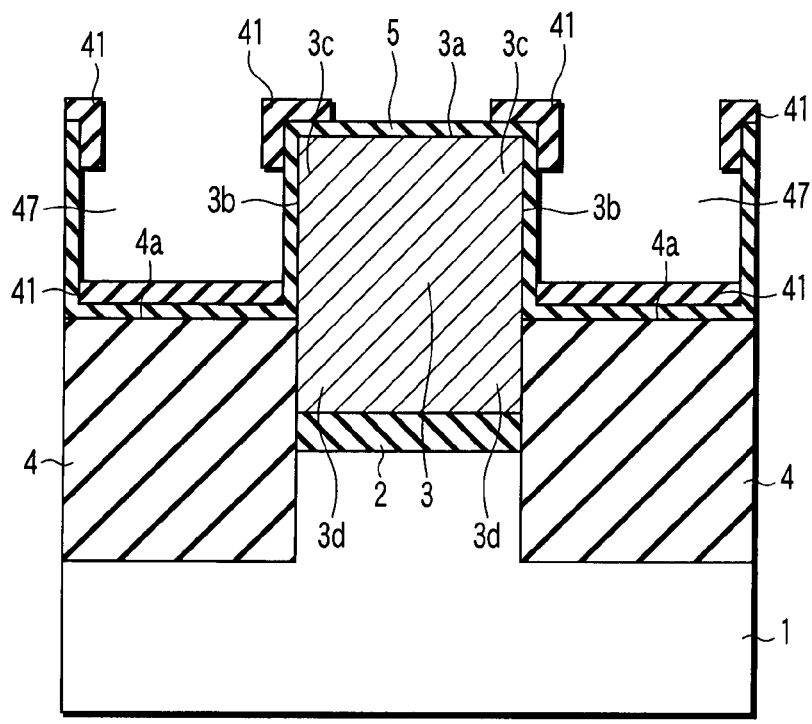
F I G. 14A
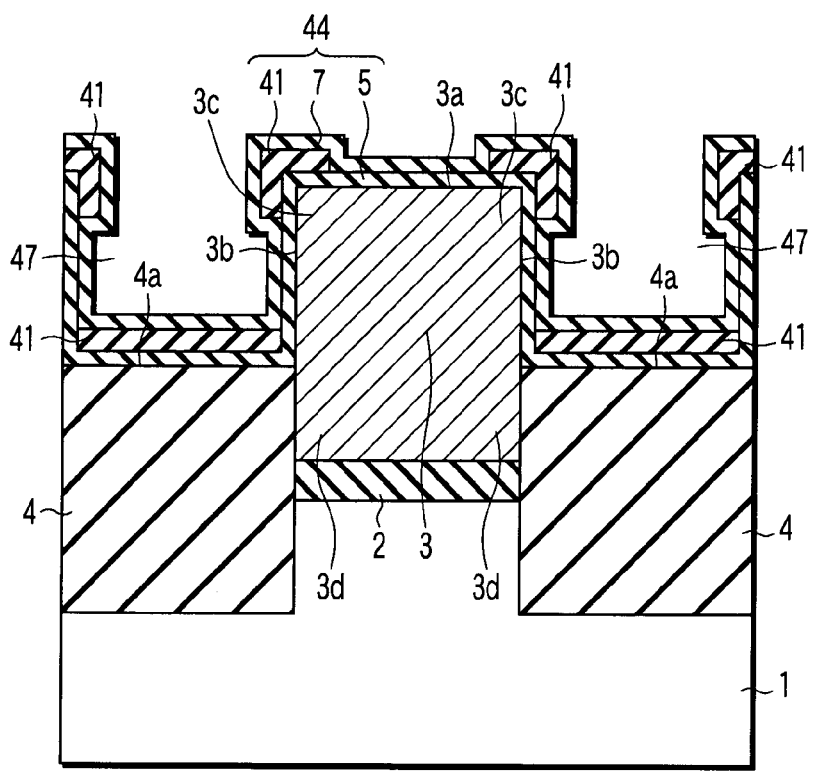
F I G. 14B

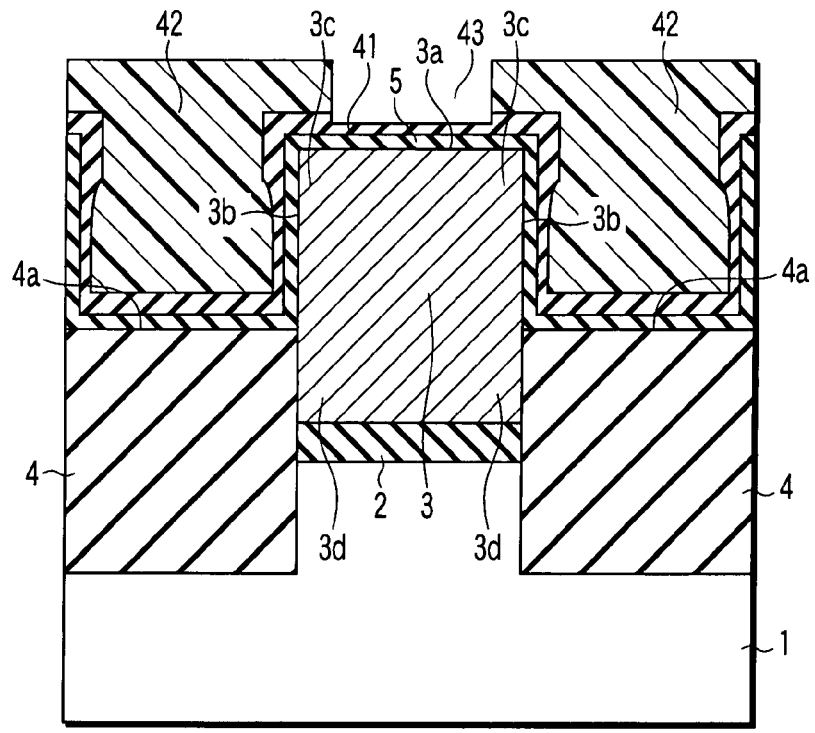
F I G. 18A
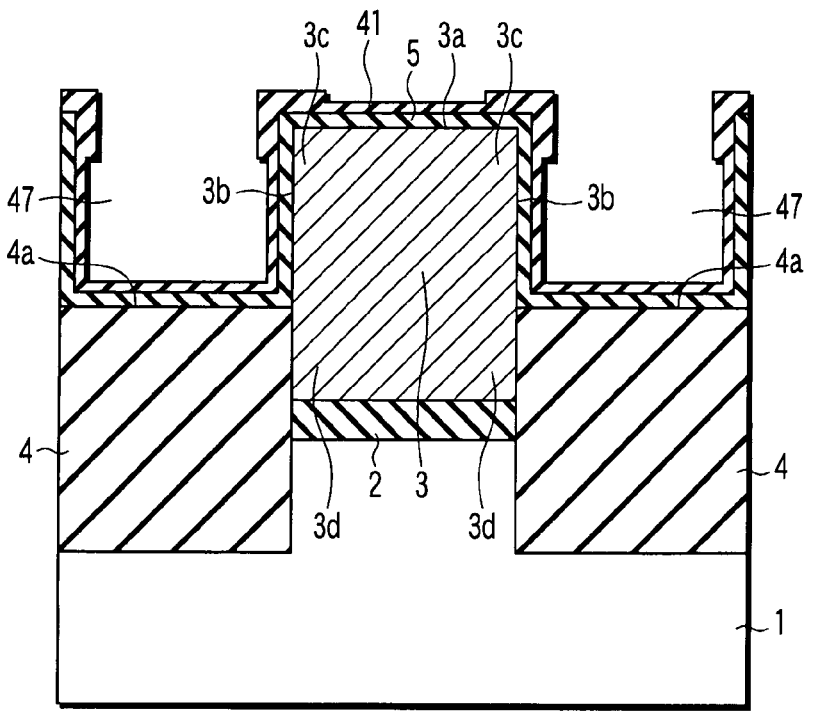
F I G. 18B

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2006-130340, filed May 9, 2006, the entire contents of which are incorporated herein by reference.

BACKGROUND OF THE INVENTION

1. Field of the Invention

The present invention relates to a semiconductor device and a method for manufacturing the device, and particularly to a floating gate EEPROM in which an inter-poly dielectric film is thinned and a method for manufacturing the EEPROM.

2. Description of the Related Art

Semiconductor devices include a rewritable nonvolatile memory referred to as a floating gate electrically erasable programmable read-only memory (EEPROM). One example of such a floating gate EEPROM is disclosed in Jpn. Pat. Appln. KOKAI Publication No. 11-204788, for example. In order to make this floating gate EEPROM smaller, it is necessary to reduce thickness of a tunnel gate dielectric film or an inter-poly dielectric (IPD) film. However, if the IPD film is reduced in thickness, there increases a danger that a leakage current is easily generated or the leakage current increases. If the leakage current is generated or increases, data holding characteristics of a nonvolatile memory easily deteriorates. Therefore, it is difficult to thinly form the IPD film in order to maintain data holding characteristics of the nonvolatile memory.

There exists a technique of three-dimensionally forming memory cells (capacitors) in order to obviate a tradeoff problem between maintenance of the data holding characteristics of such a nonvolatile memory and size reduction of the EEPROM due to reduction of the IPD film in thickness. According to this technique, a square area of the IPD can be increased without reduction of its thickness. Thus, the data holding characteristics of the nonvolatile memory can be maintained while generation and increase of a leakage current are restrained. In other words, the EEPROM can be made smaller while the capacitance of memory cells is maintained.

However, even if a three-dimensional capacitor structure is employed, it is impossible to avoid reduction of the IPD film in thickness in order to enable further size reduction of the EEPROM. One of the reasons is that the space between control gate electrodes is embedded with the IPD. If the IPD film is reduced in thickness in a three-dimensional capacitor structure, electric field concentration easily occurs at corner portions (top corner portions) of a floating gate electrode that comes into contact with the IPD film rather than planer portions (flat portions) such as top surface and side surface of the floating gate electrode that comes into contact with the IPD film. As a result, a leakage current easily flows at the corner portions of the floating gate electrode. As a result of these processes, electric charges accumulated on the floating gate electrode are released, and thus, the data holding characteristics of the nonvolatile memory deteriorates. In other words, when a three-dimensional capacitor structure is employed, reduction of the IPD film in thickness first reaches a limit at the corner portions of the floating gate electrode.

BRIEF SUMMARY OF THE INVENTION

According to an aspect of the invention, there is provided a semiconductor device comprising: a gate dielectric film provided on at least one site on a surface of a semiconductor substrate; at least one first gate electrode provided on the gate dielectric film; an inter-electrode dielectric film provided while covering a surface of the first gate electrode, at least partial film thickness of a portion covering a portion other than a corner portion that does not come into contact with the gate dielectric film from among a plurality of corner portions of the first gate electrode being formed to be smaller than at least partial film thickness of a portion covering the corner portion that does not come into contact with the gate dielectric film; and a second gate electrode provided while covering a surface of the inter-electrode dielectric film.

According to another aspect of the invention, there is provided a method for manufacturing a semiconductor device, comprising: providing a gate dielectric film on at least one site on a surface of a semiconductor substrate; providing at least one first gate electrode on the gate dielectric film; providing an inter-electrode dielectric film while covering a surface of the first gate electrode such that film thickness of at least part of a portion covering a portion other than a corner portion that does not come into contact with the gate dielectric film among a plurality of corner portions of the first gate electrode is made smaller than film thickness of at least part of a portion covering the corner portion that does not come into contact with the gate dielectric film; and providing a second gate electrode while covering a surface of the inter-electrode dielectric film.

BRIEF DESCRIPTION OF THE SEVERAL VIEWS OF THE DRAWING

FIGS. 1A and 1B are process sectional views each showing a method for manufacturing a semiconductor device according to a first embodiment;

FIGS. 2A and 2B are process sectional views each showing the method for manufacturing a semiconductor device according to the first embodiment;

FIG. 3 is a process sectional view showing the method for manufacturing a semiconductor device according to the first embodiment;

FIGS. 5A and 5B are process sectional views each showing a method for manufacturing a semiconductor device according to a second embodiment;

FIG. 7 is a sectional view taken along the broken line B-B' in FIG. 3;

FIGS. 8A and 8B are process sectional views each showing a method for manufacturing a semiconductor device according to a third embodiment;

FIGS. 14A and 14B are process sectional views showing the method for manufacturing a semiconductor device according to the fourth embodiment;

FIGS. 18A and 18B are process sectional views each showing a method for manufacturing a semiconductor device according to a sixth embodiment;

DETAILED DESCRIPTION OF THE INVENTION

Now, embodiments according to the present invention will be described with reference to the accompanying drawings.

First Embodiment

Figure 4:
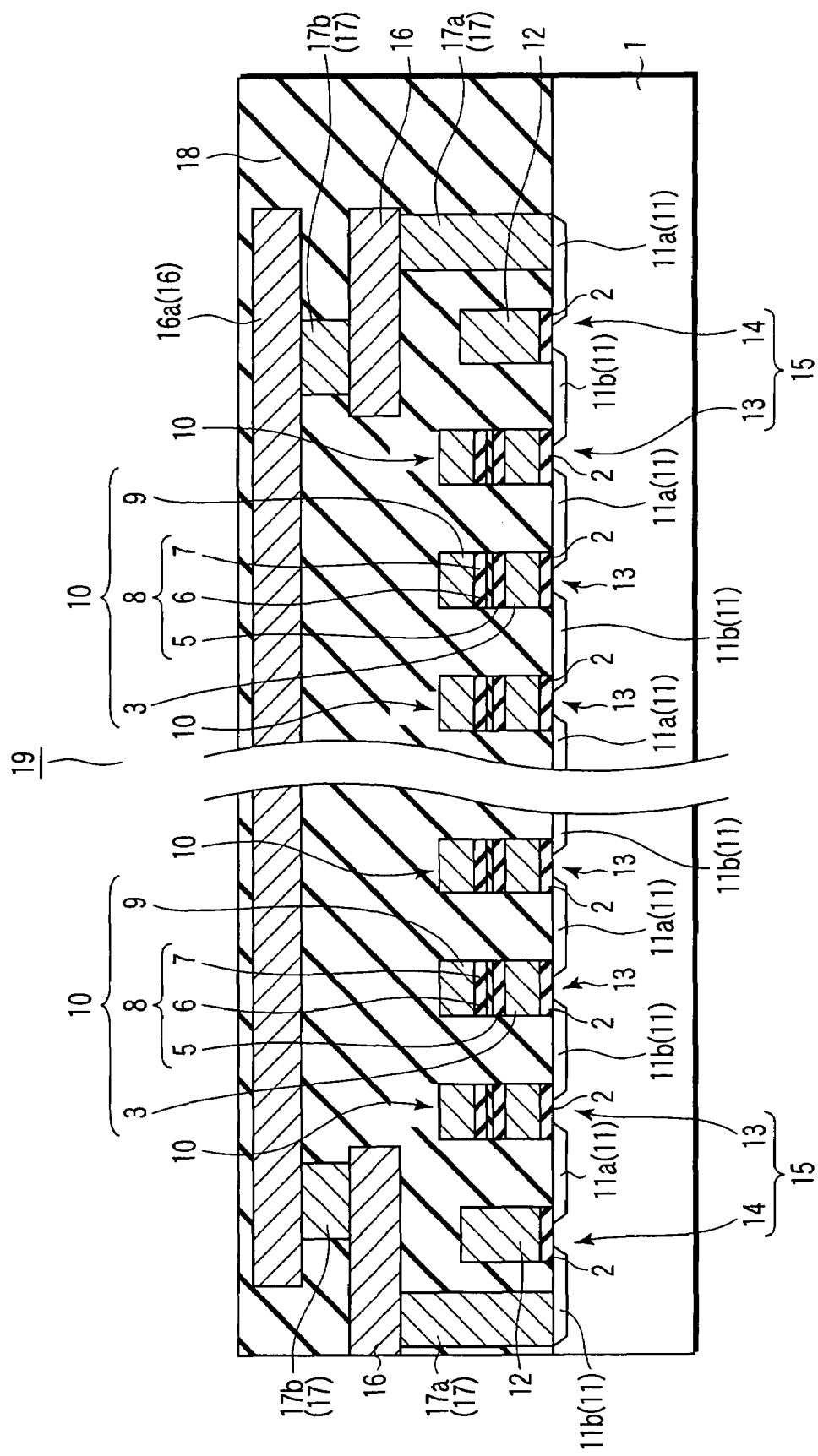
FIG. 4 is a sectional view taken along the broken line A-A' in FIG. 3.

First, a first embodiment according to the present invention will be described with reference to FIGS. 1A to 4. FIGS. 1A to 3 are process sectional views each showing a method for manufacturing a semiconductor device according to the present embodiment. FIG. 4 is a sectional view taken along the broken line A-A' in FIG. 3.

The present embodiment is particularly applied to a rewritable nonvolatile memory referred to as so-called floating gate type electrically erasable programmable read-only memory (EEPROM), among the semiconductor devices, and a method for manufacturing the memory. In addition, the present embodiment describes a floating gate EEPROM in which size reduction is enabled and degradation of electrical characteristics is restrained, and a method for manufacturing the EEPROM.

In order to make the floating gate EEPROM smaller, it is important to make an inter-poly dielectric (IPD) film provided on a floating gate thinner. However, if the IPD film is made thinner, electric field concentration easily occurs near the corner portions of the floating gate, and an increase in leakage current becomes eventually unavoidable. The present embodiment describes a technique of selectively changing the thickness of the inter-poly dielectric film between a portion at which an electric field is easily concentrated and a portion at which an electric field is hardly concentrated, thereby restraining or reducing an increase in leakage current and effectively enabling reduction of the IPD film in thickness. Hereinafter, a description will be given specifically and in detail.

First, as shown in FIG. 1A, on a surface of a silicon wafer 1 serving as a semiconductor substrate, a tunnel gate dielectric film 2 is provided in accordance with the thermal oxidization technique or the like. This tunnel gate dielectric film 2 is formed using a silicon oxide ($SiO_2$) film, for example. Then, on this tunnel gate dielectric film 2, a floating gate electrode 3 serving as a first gate electrode is provided in accordance with the CVD technique or the like. This floating gate electrode 3 is formed by way of doping phosphorus (P) that serves as an N-type impurity, for example, in a poly-crystalline silicon (poly-silicon) film.

Then, element isolation areas 4 made of a so-called shallow trench isolation (STI) structure are formed on a top layer portion of the silicon wafer 1 so as to come into contact with each of the left and right side faces of each of the tunnel gate dielectric film 2 and the floating gate electrode 3. Each of the element isolation areas 4 is formed by embedding a dielectric film such as a silicon oxide film ($SiO_2$) or a silicon nitride film (SiN) in the top layer portion of the silicon wafer 1 in accordance with techniques such as the RIE technique, the CVD technique, and the CMP technique. At this time, each of the element isolation areas 4 is formed at a height at which a top face 4a of each of these areas is positioned at an intermediate portion of each of the left and right side faces of the floating gate electrode 3. In this manner, an upper portion from an intermediate portion in a vertical direction of the floating gate electrode 3 is exposed from each of the element isolation areas 4. In other words, among planar portions of the floating gate electrode 3, a top face 3a and portions (upper side face) 3b from the intermediate portion to the top portion of each of the left and right side faces are exposed from each of the element isolation areas 4.

Therefore, at this stage, of course, among a plurality of corner portions 3c and 3d of the floating gate electrode 3, surfaces of the left and right upper corner portions 3c, serving as corner portions that do not come into contact with the tunnel gate dielectric film 2, are exposed. In contrast, among the plurality of corner portions 3c and 3d of the floating gate electrode 3, surfaces of the left and right lower corner portions 3d, serving as corner portions that come into contact with the tunnel gate dielectric film 2, are covered with the tunnel gate dielectric film 2 and each of the element isolation areas 4.

Then, as shown in FIG. 1A, a first inter-electrode dielectric film 5 is provided in accordance with the CVD technique or the like while an exposed portion of the floating gate electrode 3 and a surface of each of the element isolation areas 4 are covered. As described later, in the present embodiment, an inter-electrode dielectric film 8 provided between the floating gate electrode 3 and a control gate electrode 9 provided upwardly thereof, is formed as a laminate film made by laminating dielectric films in three layers. Therefore, the first inter-electrode dielectric film 5 is obtained as a lower inter-electrode dielectric film of the inter-electrode dielectric film 8 (inter-electrode dielectric film serving as a first layer). It is preferable to use an oxide film, for example, for this first inter-electrode dielectric film 5. The present embodiment assumes that a silicon oxide ($SiO_2$) film is used as the first inter-electrode dielectric film 5. The $SiO_2$ film 5 is formed such that its entire film thickness becomes substantially uniform.

Next, as shown in FIG. 1B, while a surface of the $SiO_2$ (first inter-electrode dielectric) film 5 is covered, a second inter-electrode dielectric film 6 is provided in accordance with the chemical vapor deposition technique or the like at an atmospheric temperature equal to or higher than 700° C. This second inter-electrode dielectric film 6 is obtained as an intermediate inter-electrode dielectric film of the inter-electrode dielectric film 8 (inter-electrode dielectric film serving as a second layer). In addition, it is preferable to use a nitride film, for example, for the second inter-electrode dielectric film 6. The present embodiment assumes that a silicon nitride ($Si_3N_4$) film is used as the second inter-electrode dielectric film 6. In addition, at this stage, the $Si_3N_4$ film 6 is formed such that its entire film thickness becomes substantially uniform, as the $SiO_2$ film 5.

Next, as shown in FIG. 2A, the $Si_3N_4$ (second inter-electrode dielectric) film 6 is selectively and partially reduced in thickness. Specifically, the RIE technique serving as one type of dry etching is fully applied to the $Si_3N_4$ film 6. In this manner, the $Si_3N_4$ film 6 is etched in an anisotropic manner along a vertical direction of the floating gate electrode 3. As a result, as shown in FIG. 2A, the $Si_3N_4$ film 6 provided upwardly of the floating gate electrode 3 and each of the element isolation areas 4 is formed such that the film thickness taken along a direction vertical to a surface of the silicon wafer 1 (thickness direction of silicon wafer 1, vertical direction) is smaller than that taken along a direction parallel to a surface of the silicon wafer 1 (planar direction of silicon wafer 1, transverse direction).

Specifically, the film thickness, in a direction vertical to the top face 3a of the floating gate electrode 3, of the $Si_3N_4$ film 6 provided upwardly of the top face 3a of the floating gate electrode 3 (film thickness in longitudinal direction) is formed to be smaller than the film thickness, in a direction vertical to each of the left and right upper side faces 3b of the flowing gate electrode 3, of the $Si_3N_4$ film 6 provided laterally of each of the left and right upper side faces 3b of the floating gate electrode 3 (film thickness in transverse direction). Similarly, the film thickness, in a direction vertical to a top face 4a (top face 3a of floating gate electrode 3) of each of the element isolation areas 4, of the $Si_3N_4$ film 6 provided upwardly of a portion (center portion) excluding a rim portion of the top face 4a of each of the element isolation areas 4 (film thickness in longitudinal direction) is formed to be smaller than the film thickness, in a direction vertical to each of the left and right upper side faces 3b of the floating gate electrode 3, of the $Si_3N_4$ film 6 provided laterally of each of the left and right upper side faces 3b of the floating gate electrode 3 (film thickness in transverse direction).

In other words, briefly speaking, the $Si_3N_4$ film 6 above the top face 3a of the floating gate electrode 3 is formed to be smaller in thickness than the $Si_3N_4$ film 6 formed laterally of each of the left and right upper side faces 3b of the floating gate electrode 3. Therefore, of course, among the $Si_3N_4$ films 6 provided at the periphery (in the vicinity) of each of the upper corner portions 3c of the floating gate electrode 3, an upward portion of the top face 3a of the floating gate electrode 3 is formed to be smaller in thickness than a lateral portion of each of the upper side faces 3b of the floating gate electrode 3. Similarly, among the $Si_3N_4$ films 6 provided upwardly of the top face 4a of each of the element isolation areas 4, the $Si_3N_4$ film 6 provided upwardly of a portion (center portion) excluding a rim portion of each of the top faces 4a, is formed to be smaller in thickness than the $Si_3N_4$ film 6 provided laterally of each of the upper side faces 3b of the floating gate electrode 3.

Next, as shown in FIG. 2B, a third inter-electrode dielectric film 7 is provided in accordance with the CVD technique or the like while covering a surface of the $Si_3N_4$ (second inter-electrode dielectric) film 6 of which the film thickness in a vertical direction is formed to be smaller than that in a transverse direction. This third inter-electrode dielectric film 7 is obtained as an upper inter-electrode dielectric film of the inter-electrode dielectric film 8 (inter-electrode dielectric film serving as a third layer). In addition, it is preferable to use an oxide film, for example, for the third inter-electrode dielectric film 7 as in the first inter-electrode dielectric film 5. The present embodiment assumes that a silicon oxide ($SiO_2$) film is used as the third inter-electrode dielectric film 7. This upper $SiO_2$ film 7 is formed such that its entire film thickness becomes substantially uniform, as in the lower $SiO_2$ film 5.

In accordance with the process described above, as shown in FIG. 2B, the inter-electrode dielectric film 8, formed of a three-layered structure of the $SiO_2$ (lower inter-electrode dielectric) film 5, the $Si_3N_4$ film (intermediate inter-electrode dielectric layer) 6, and the $SiO_2$ (upper inter-electrode dielectric) film 7, is formed while covering a surface of each one of the floating gate electrode 3 and each of the element isolation areas 4. As described previously, in the inter-electrode dielectric film 8, the film thickness in the longitudinal direction of the $Si_3N_4$ film 6 serving as its intermediate inter-electrode dielectric film is formed to be smaller than the film thickness in the transverse direction thereof. Thus, with respect to the entire inter-electrode dielectric film 8 as well, its film thickness in the longitudinal direction is formed to be smaller than the film thickness in the transverse direction. Therefore, of course, among the inter-electrode dielectric film 8, the film thickness of at least part of a portion that covers a portion excluding each of the corner portions 3c of the floating gate electrode 3 is formed to be smaller than that of at least part of a portion that covers each of the upper corner portions 3c. Specifically, among the inter-electrode dielectric film 8 provided while covering each of the upper corner portions 3c of the floating gate electrode 3, the inter-electrode dielectric film 8 on the top face 3a of the floating gate electrode 3 is formed to be smaller in thickness than the inter-electrode dielectric film 8 on each of the upper side faces 3b of the floating gate electrode 3.

Similarly, among the inter-electrode dielectric film 8 provided on the top face 4a of each of the element isolation areas 4, the inter-electrode isolation film 8 provided on a portion excluding a rim portion of each of the top faces 4a is formed to be smaller in thickness than that provided on each of the upper side faces 3b of the floating gate electrode 3. In other words, among the inter-electrode dielectric film 8 provided on the top face 4a of each of the element isolation areas 4, the inter-electrode dielectric film 8 provided on the center portion of each of the top faces 4a is formed to be smaller in thickness than that provided on a rim portion of each of the top faces 4a.

According to tests carried out by the inventors, it has been found that, as long as the film thickness of the thickly formed portion of the inter-electrode dielectric film 8 is larger by about 1.2 times or more than that of the thinly formed (processed) portion of the inter-electrode dielectric film 8, it is possible to retain or reduce a danger that electric field concentration or a leakage current occurs at the periphery of the floating gate electrode 3. In particular, it has been found that, if the film thickness of the inter-electrode dielectric film 8 in at least part of the vicinity of each of the upper corner portions 3c of the floating gate electrode 3 is set at a thickness larger by about 1.2 times or more than that of the inter-electrode dielectric film 8 in at least part of other portions, it is possible to restrain or reduce a danger that electric field concentration or a leakage current occurs in the vicinity of each of the corner portions 3c of the floating gate electrode 3.

Therefore, the present embodiment assumes that the film thickness of the thick inter-electrode dielectric film 8 provided laterally of each of the upper side faces 3b of the floating gate electrode 3 is set at a thickness larger by about 1.2 times or more than that of the thin inter-electrode dielectric film 8 provided upwardly of the top face 3a of the floating gate electrode 3. In other words, in the present embodiment, the film thickness of each one of the lower SiO$_2$ film 5, the Si$_3$N$_4$ film 6, and the upper SiO$_2$ film 7 is properly set at a proper value such that the film thickness of the thick portion of the inter-electrode dielectric film 8 is set at a thickness larger by about 1.2 times or more than that of the thin portion of the inter-electrode dielectric film 8. At this time, in particular, it is important to properly set the film thickness of the thick portion of the Si$_3$N$_4$ film 6 and that of the thin portion of the Si$_3$N$_4$ film 6 at proper values by means of the above-described method such that the film thickness of the thick portion of the inter-electrode dielectric film 8 is set at a thickness larger by about 1.2 times or more than that of the thin portion of the inter-electrode dielectric film 8. A ratio in film thickness between the thick portion and the thin portion of such an inter-electrode dielectric film 8 will be set in the same manner in each of second to seventh embodiments described later. In particular, a ratio in film thickness between the thick portion and the thin portion of the Si$_3$N$_4$ film 6 will be set in the same manner in each of the sixth and seventh embodiments described later.

As in the inter-electrode dielectric film 8 according to the present embodiment, an inter-electrode dielectric film formed by laminating a plurality of dielectric films 5, 6, and 7 is also referred to as an inter-poly dielectric film (IPD), in general. In addition, as in the inter-electrode dielectric film 8 according to the present embodiment, a structure of a laminate film made of three layers, i.e., the oxide film 5, the nitride film 6, and the oxide film 7, is abbreviated as an ONO structure, in general.

Next, as shown in FIG. 3, on the inter-poly dielectric film (IPD) 8, a control gate electrode 9 serving as a second gate electrode is provided in accordance with the CVD technique or the like. This control gate electrode 9 is also formed by doping phosphorus (P) serving as an N-type impurity, for example, in a poly-crystalline silicon (poly-silicon) film 9, as is the case with the floating gate electrode 3. The control gate electrode 9 functions as a so-called word line. In accordance with the process described above, a three-dimensional capacitor structure 10, obtained by sandwiching the inter-poly dielectric film 8 of a three-layered structure between the floating gate electrode 3 and the control gate electrode 9, is provided on a surface of the silicon wafer 1.

Next, as shown in FIG. 4, impurity diffusion areas (transistor diffusion layers) 11 serving as source areas 11a or drain areas 11b are formed in plural sites of a top layer portion of the silicon wafer 1. Each of the impurity diffusion areas 11 is formed at a top layer portion of the silicon wafer 1 in accordance with the ion implantation technique while using each of the tunnel gate dielectric films 2, each of the floating gate electrodes 3, each of the inter-poly dielectric films 8, and each of the control gate electrodes 9 as masks. As a result, each of the impurity diffusion areas 11 is formed at the top layer portion of the silicon wafer 1 while covering a lower face of a rim portion of each of the tunnel gate dielectric films 2 between the adjacent tunnel gate dielectric films 2.

In addition, as shown in FIG. 4, on the surface of the silicon wafer 1, selection gate electrodes 12 serving as a third gate electrode are provided in plural sites together with each of the floating gate electrodes 3 and each of the control gate electrodes 9. These selection gate electrodes 12 are provided on the tunnel gate dielectric films 2 as the floating gate electrodes 3. The tunnel gate dielectric films 2, the floating gate electrodes 3, the inter-poly dielectric films 8, and the control gate electrodes 9 configure a storage transistor 13 together with the source areas 11a and the drain areas 11b. In contrast, the selection gate electrodes 12 each configure a selection transistor 14 together with the source areas 11a and the drain areas 11b. Then, the storage transistors 13 each configure memory cells 15 together with the selection transistors 14. FIG. 4 is a sectional view taken along the broken line A-A' in FIG. 3.

Then, as shown in FIG. 4, a plurality of wires 16 including so-called bit lines 16a are provided upwardly of the control gate electrode 9. The bit lines 16a are formed after being extended along a direction orthogonal to an extending direction of the control gate electrode 9 that serves as a word line. In addition, plugs 17 such as contact plugs 17a for electrically connecting each wire 16 and a surface (top layer portion) of the silicon wafer 1 or via plugs 17b for electrically connecting the wires 16 to each other are provided in plurality on the silicon wafer 1. Each of the contact plugs 17a is formed while a predetermined source area 11a or a predetermined drain area 11b is electrically connected to a predetermined wire 16.

The floating gate electrodes 3, the control gate electrodes 9, the selection gate electrodes 12, the wires 16, the plugs 17 and the like are practically provided in any of a plurality of inter-layered dielectric films provided after being laminated in a plurality of layers on the silicon wafer 1. However, in FIG. 4, for the sake of clarity, a plurality of inter-layered dielectric films provided after being laminated in a plurality of layers on the silicon wafer 1 are collectively shown as a single inter-layered dielectric film 18. This inter-layered dielectric film 18 is also referred to as a pre-metal dielectric film. Similarly, although barrier metal films are generally provided on the wires 16 and the plugs 17 while covering their surfaces, the barrier metal films are not shown for the sake of illustrative clarity in FIG. 4. Such an illustrative manner is also employed in FIGS. 7, 11, 12, 20, and 21 referenced in the second to seventh embodiments, each of which will be described later. Further, in FIGS. 1A to 3, for the sake of simplifying explanation, one of the floating gate electrodes 3 shown in FIG. 4 and its neighboring structure are shown. Such an illustrative manner is also employed in FIGS. 5A, 5B, 6, 8A to 10, 13A to 19, and 22 referenced in the second to seventh embodiments, each of which will be described later.

Thereafter, although a specific and detailed description together with illustration is omitted, a rewritable nonvolatile memory 19 is obtained as a storage-type semiconductor device made of a desired structure by executing a predetermined process such as a bonding process or a packaging process. In other words, as shown in FIGS. 3 and 4, a floating gate EEPROM 19 is obtained. The floating gate EEPROM 19 has the three-dimensional capacitor structure 10 obtained by providing, between each of the floating gate electrodes 3 and each of the control gate electrodes 9, the inter-poly dielectric film (IPD) 8 having the ONO structure in which the SiO$_2$ film 5, the Si$_3$N$_4$ film 6, and the SiO$_2$ film 7 are laminated in three layers in this order from the lowest layer. Also in the floating gate EEPROM 19, among the IPD films 8 (Si$_3$N$_4$ films 6) provided at the periphery of each of the upper corner portions 3c of the floating gate electrode 3, the inter-poly dielectric film 8 (Si$_3$N$_4$ film 6) above the top face 3a of the floating gate electrode 3 is formed to be smaller in thickness than the inter-poly dielectric film 8 (Si$_3$N$_4$ film 6) formed laterally of each of the upper side faces 3b of the floating gate electrode 3.

FIGS. 1A to 3 are sectional views taken along a direction (longitudinal direction) in which a word line (control gate electrode) 3 of the EEPROM 19 extends. In other words, FIGS. 1A to 3 are sectional views taken along a direction that is orthogonal to a direction in which the bit line 16a of the EEPROM 19 extends. In contrast, FIG. 4 is a sectional view taken along a direction (longitudinal direction) in which the bit line 16a of the EEPROM 19 extends. In other words, FIG. 4 is a sectional view taken along a direction orthogonal to a direction in which the word line 3 of the EEPROM 19 extends. In addition, such an illustrative manner is also employed in FIGS. 5A to 22 referenced in the second to seventh embodiments, each of which will be described later.

As described above, in the first embodiment, the film thickness of the inter-poly dielectric film 8 provided while covering each of the planar sections 3a and 3b and each of the upper corner portions 3c of the floating gate electrode 3 of the floating gate EEPROM 19, is set in sizes that are selectively and partially different from each other. In particular, the film thickness of the inter-poly dielectric film 8 that covers each of the upper corner portions 3c of the floating gate electrode 3 opposite to the control gate electrode 9 on which electric field concentration or a leakage current is prone to occur, is set in sizes that are different between a longitudinal direction and a transverse direction. Specifically, the inter-poly dielectric film 8 provided while covering each of the upper corner portions 3c of the floating gate electrode 3 is formed such that the film thickness of a portion covering the top face 3a of that floating gate electrode 3 is smaller in thickness than that of a portion covering each of the upper side faces 3b of the floating gate electrode 3. In other words, the inter-poly dielectric film 8 provided while covering each of the upper corner portions 3c of the floating gate electrode 3 is formed such that the film thickness of a portion covering each of the upper side faces 3b of that floating gate electrode 3 is larger in thickness than that of a portion covering the top face 3a of the floating gate electrode 3.

In a conventional floating gate EEPROM, it is generally known that, if the film thickness of an inter-poly dielectric film is reduced in order to enable size reduction and higher density of integrated circuit of the EEPROM, a leakage current easily flows between a floating gate electrode and a control gate electrode. In addition, it is also generally known that, in the case where a capacitor of the EEPROM, has a three-dimensional structure, electric field concentration easily occurs at the upper corner portions covered with the inter-poly dielectric film.

In contrast, in the present embodiment, as described previously, the inter-poly dielectric film 8 is formed while the film is selectively and partially reduced in thickness, so that the film thickness of the inter-poly dielectric film 8 covering at least each of the upper corner portions 3c of the floating gate electrode 3 is not entirely uniformly small. In this manner, in the floating gate EEPROM 19 according to the present embodiment, a limit of reduction of the inter-poly dielectric film 8 in thickness can be broadened while reducing or restraining a danger that electric field concentration or a leakage current occurs in the vicinity of each of the upper corner portions 3c of the floating gate 3, or alternatively, a leakage current increases. In other words, in the present embodiment, there can be restrained a danger that, while size reduction of the EEPROM 19 is enabled, electric characteristics of the EEPROM 19 deteriorate due to reduction of the inter-poly dielectric film 8 in thickness caused by such size reduction.

As described above, according to the present embodiment, there can be provided a floating gate EEPROM 19 in which a three-dimensional capacitor structure 10 is provided, electric field concentration or a leakage current hardly occurs in the vicinity of the upper corner portions 3c of each of the floating gate electrodes 3, and size reduction is enabled. As a result, there can be provided a floating gate EEPROM 19 in which improvements of size reduction and electrical characteristics can be compatible with each other, which have been substantially tradeoff conventionally. In addition, according to the present embodiment, there can be provided a method for manufacturing a semiconductor device that is capable of easily manufacturing such an EEPROM 19.

Second Embodiment

Figure 6:
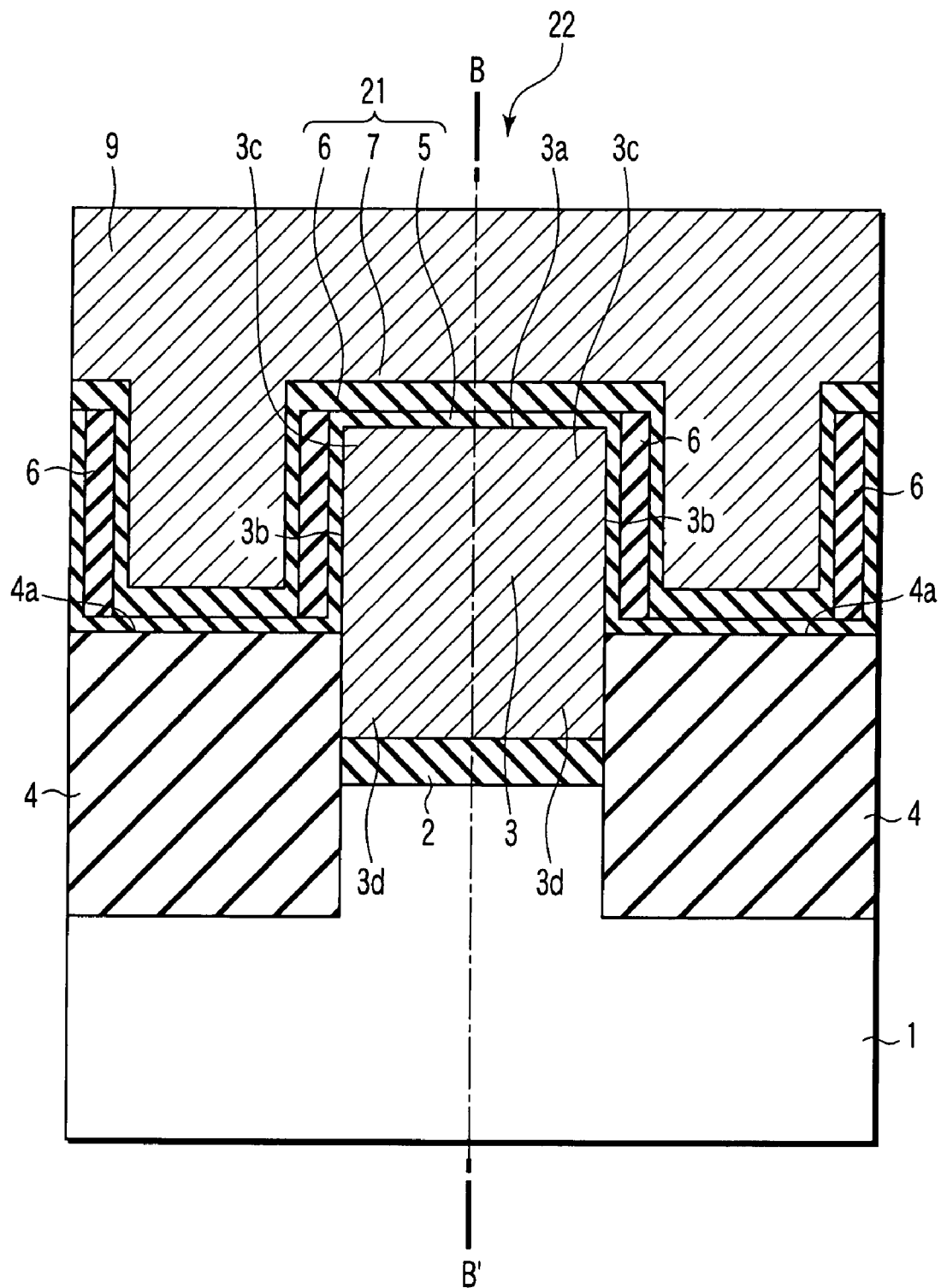
FIG. 6 is a process sectional view showing the method for manufacturing a semiconductor device according to the second embodiment.

A second embodiment according to the present invention will be described mainly with reference to FIGS. 5A to 7. FIGS. 5A, 5B, and 6 are process sectional views each showing a method for manufacturing a semiconductor device according to the present embodiment. FIG. 7 is a sectional view taken along the broken line B-B' in FIG. 6. Like constituent elements of the first embodiment described previously are designated by like reference numerals. A detailed description of these constituent elements is omitted here.

In the present embodiment, as in the first embodiment, further reduction of an inter-poly dielectric film in thickness is enabled while restraining or reducing electric field concentration or generation of a leakage current in the vicinity of upper corner portions of a floating gate electrode. As a result, further size reduction (higher density of integrated circuit) of a floating gate EEPROM is enabled while enabling improvement of electrical characteristics of the EEPROM. Now, a specific and detailed description will be given below.

First, from a process for covering a floating gate electrode 3 and each element isolation area 4 to a process for providing a $SiO_2$ film 5 as a lower inter-poly dielectric film and a $Si_3N_4$ film 6 as an intermediate inter-poly dielectric film upwardly of these electrode and area are similar to the processes described with reference to FIGS. 1A and 1B in the first embodiment.

Next, as shown in FIG. 5A, the $Si_3N_4$ film 6 is selectively and partially left on a surface (top face) of the $SiO_2$ film 5. Specifically, the $Si_3N_4$ film 6 is left only on each of upper side faces 3b of the floating gate electrode 3. Such a structure, as in the first embodiment, can be obtained by fully applying the RIE technique to the $Si_3N_4$ film 6, and then, etching the $Si_3N_4$ film 6 along its longitudinal direction in an anisotropic manner. However, in the present embodiment, unlike the first embodiment, RIE is performed until the $Si_3N_4$ film 6 is eliminated from above the top face 3a of the floating gate electrode 3 and above a portion (center portion) excluding a rim portion of a top face 4a of each of the element isolation areas 4.

As a result, the $Si_3N_4$ film 6 is fully removed from above the top face 3a of the floating gate electrode 3 and above the center portion of the top face 4a of each of the element isolation areas 4, and then, the $Si_3N_4$ film 6 is left only laterally of each of the upper side faces 3b of the floating gate electrode 3. Therefore, of course, in the vicinity of each of upper corner portions 3c of the floating gate electrode 3, the $Si_3N_4$ film 6 is selectively and partially left only laterally thereof. In addition, a surface (top face) of the $SiO_2$ film 5 is exposed from the $Si_3N_4$ film 6 upwardly of the top face 3a of the floating electrode 3 and upwardly of the center portions of the top face 4a of each of the element isolation areas 4.

Next, as shown in FIG. 5B, in accordance with the processes similar to those of the first embodiment, a $SiO_2$ film 7 is provided as an upper inter-poly dielectric film while covering a surface of the $Si_3N_4$ film 6 selectively and partially left on the surface of the lower $SiO_2$ film 5 and a surface of the $SiO_2$ film 5 selectively and partially exposed from the $Si_3N_4$ film 6. This upper $SiO_2$ film 7, as in the first embodiment, is formed such that its entire film thickness becomes substantially uniform.

In accordance with the processes described above, as shown in FIG. 5B, an inter-poly dielectric film 21 of a three-layered structure obtained by sandwiching the $Si_3N_4$ film 6 between the lower $SiO_2$ film 5 and the upper $SiO_2$ film 7 laterally of each of the upper side faces 3b of the floating gate electrode 3, is formed while covering a surface of each one of the floating gate electrode 3 and the element isolation areas 4. As described above, in the inter-poly dielectric film 21 according to the present embodiment, unlike the inter-poly dielectric film 8 of the first embodiment described previously, the $Si_3N_4$ film 6 is provided only laterally of each of the upper side faces 3b of the floating gate electrode 3. Therefore, the inter-poly dielectric film 21 according to the present embodiment is formed such that the film thickness thereof in the longitudinal direction is smaller in comparison with the inter-poly dielectric film 8 according to the first embodiment. In the present embodiment, among the inter-poly dielectric film 21, the film thickness of a portion of a three-layered structure provided laterally of each of the upper side faces 3b of the floating gate electrode 3 is set at a thickness larger by about 1.2 times or more than that of a portion of a two-layered structure provided above the top face 3a of the floating gate electrode 3.

Next, as shown in FIG. 6, in accordance with the processes similar to those of the first embodiment, a control gate electrode 9 is provided on the inter-poly dielectric film 21. In this manner, a three-dimensional capacitor structure 22, obtained by sandwiching the inter-poly dielectric film 21 having a partial ONO structure (three-layered structure) between the floating gate electrode 3 and the control gate electrode 9, is provided on a surface of a silicon wafer 1.

Next, as shown in FIG. 7, in accordance with the processes similar to those of the first embodiment, a plurality of source areas 11a and drain areas 11b are formed at a top layer portion of the silicon wafer 1. In addition, a plurality of selection gate electrodes 12 are provided on each of tunnel gate dielectric films 2. The tunnel gate dielectric films 2, the floating gate electrodes 3, the inter-poly dielectric films 21, and the control gate electrodes 9 configure a storage transistor 23 together with the source areas 11a and the drain areas 11b. The storage transistors 23 each configure memory cells 24 together with the selection transistors 14. Then, wires 16 including bit lines 16a and plugs 17 such as contact plugs 17a and via plugs 17b are provided in plurality on the silicon wafer 1. FIG. 7 is a sectional view taken along the broken line B-B' in FIG. 6.

Then, although a specific and detailed description together with illustration is omitted, as in the first embodiment, a rewritable nonvolatile memory 25 serving as a storage-type semiconductor device having a desired structure is obtained by executing a predetermined process such as a bonding process or a packaging process. In other words, as shown in FIGS. 6 and 7, a floating gate EEPROM 25 is obtained as having a three-dimensional capacitor structure 22 in which an inter-poly dielectric film (IPD) 21 having a partial ONO structure is provided between each of the floating gate electrodes 3 and each of the control gate electrodes 9. The partial ONO structure is made of a two-layered structure of the lower $SiO_2$ film 5 and the upper $SiO_2$ film 7 between the top face 3a of each of the floating gate electrodes 3 and the center portion of the top face 4a of each of the element isolation areas 4 and each of the control gate electrodes 9, and is made of a three-layered structure of the lower $SiO_2$ film 5, the $Si_3N_4$ film 6, and the upper $SiO_2$ film 7 between each of the upper side faces 3b of the floating gate electrodes 3 and each of the control gate electrodes 9.

As has been described above, according to the second embodiment, an advantageous effect similar to that of the first embodiment described previously can be attained. In addition, in the EEPROM 25 according to the present embodiment, unlike the EEPROM 19 of the first embodiment, the $Si_3N_4$ film 6 is selectively and partially left only upwardly of part of each of the upper corner portions 3c instead of fully covering each of the upper corner portions 3c of each of the floating gate electrodes 3. Specifically, in the vicinity of each of the upper corner portions 3c of each of the floating gate electrodes 3 of the EEPROM 25 according to the present embodiment, the $Si_3N_4$ film 6 is selectively and partially left laterally of the upper corner portions 3c, i.e., in a lateral direction of the EEPROM 25. In contrast, the $Si_3N_4$ film 6 is not left above the top face 3a of the floating gate electrode 3 or above the center portion of the top face 4a of each of the element isolation areas 4, i.e., in the longitudinal direction of the EEPROM 25.

Therefore, in the EEPROM 25 according to the present embodiment, the inter-poly dielectric film 21 is smaller in thickness in its longitudinal direction in comparison with the EEPROM 19 according to the first embodiment. In other words, the EEPROM 25 according to the present embodiment enables further size reduction and higher density of integrated circuit in its longitudinal direction in comparison with the EEPROM 19 according to the first embodiment.

Third Embodiment

Figure 11:
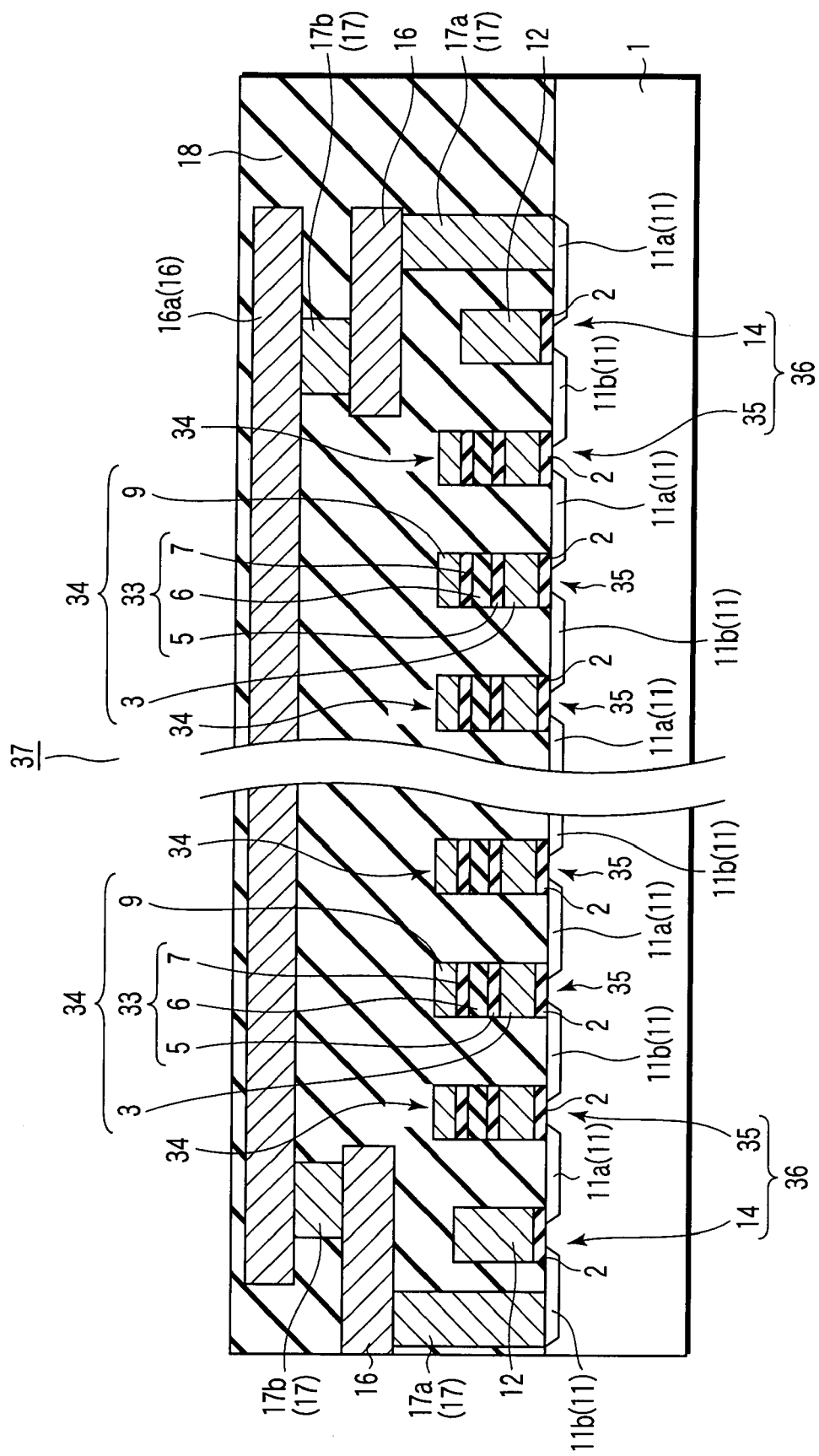
FIG. 11 is a sectional view taken along the broken line C-C' in FIG. 10.
Figure 12:
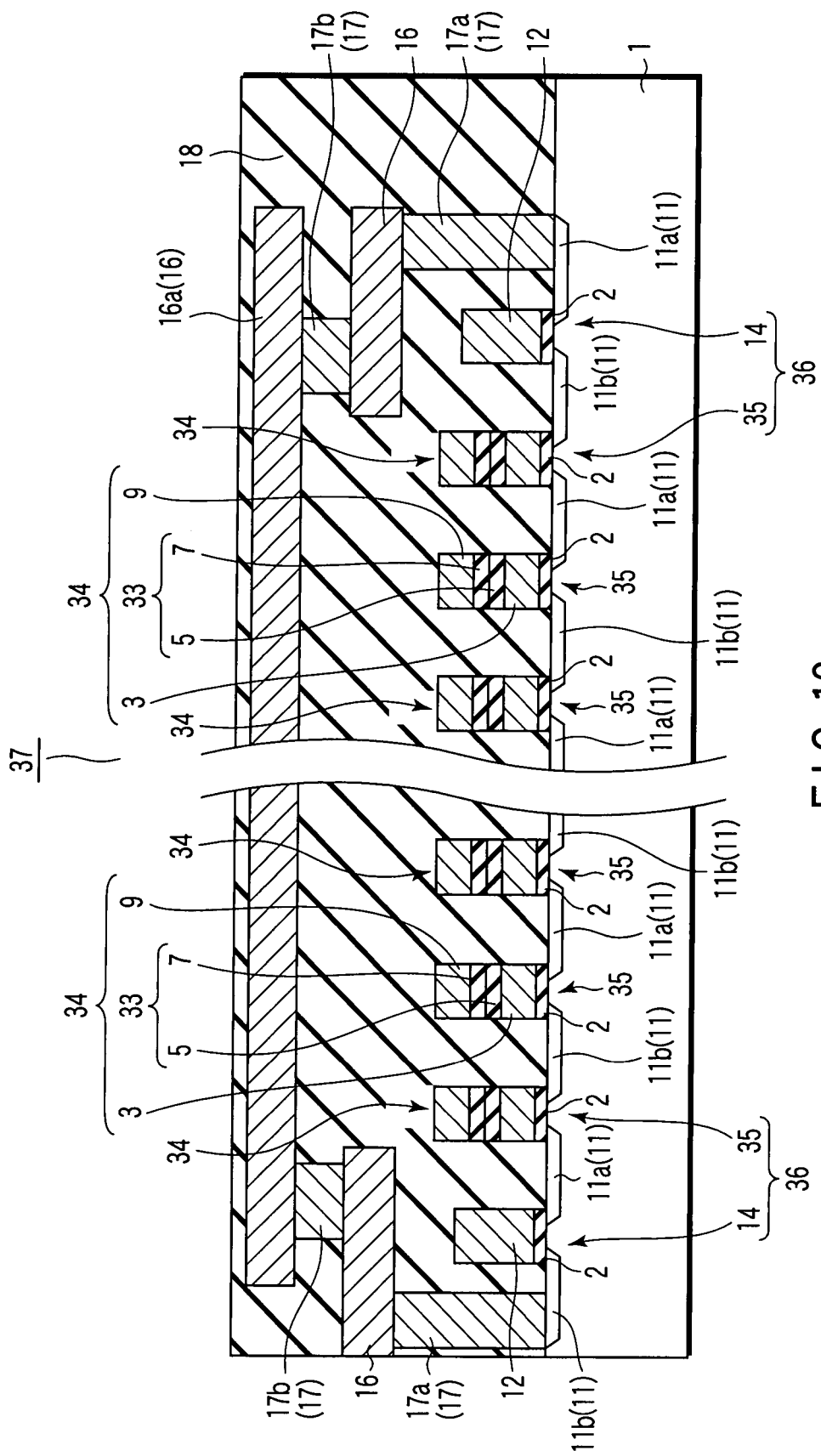
FIG. 12 is a sectional view taken along the broken line D-D' in FIG. 10.

Now, a third embodiment according to the present invention will be described mainly with reference to FIGS. 8A to 12. FIGS. 8A to 10 are process sectional views each showing a method for manufacturing a semiconductor device according to the present embodiment. FIG. 11 is a sectional view taken along the broken line C-C' in FIG. 10. FIG. 12 is a sectional view taken along the broken line D-D' in FIG. 10. Like constituent elements in each of the first and second embodiments described previously are designated by like reference numerals. A detailed description of these constituent elements is omitted here.

In the present embodiment, unlike each of the first and second embodiments, further reduction of an inter-poly dielectric film in thickness is enabled only upwardly of part of a top face of a floating gate electrode. Now, a specific and detailed description will be given below.

First, from a process for covering a floating gate electrode 3 and each element isolation area 4 to a process for providing a $SiO_2$ film 5 as a lower inter-poly dielectric film and a $Si_3N_4$ film 6 as an intermediate inter-poly dielectric film upwardly of these electrode and area are similar to the processes described with reference to FIGS. 1A and 1B in the first embodiment.

Next, as shown in FIG. 8A, a resist film 31 is provided while covering a surface of the $Si_3N_4$ film 6. Then, an opening 32 is formed in the resist film 31 by using a general lithography technique so that, among the $Si_3N_4$ films 6, a surface of the $Si_3N_4$ film 6 provided above a portion (center portion) excluding a rim portion of a top face 3a of the floating gate electrode 3 is exposed. In other words, the opening 32 is formed in the resist film 31 in accordance with the lithography process so that, among the $Si_3N_4$ films 6 provided on the top face 3a of the floating gate electrode 3, the surface of the $Si_3N_4$ film 6 provided above a portion excluding each of the upper corner portions 3c of the floating gate electrode 3 is exposed.

Next, as shown in FIG. 8B, only the $Si_3N_4$ film 6 exposed from the opening 32 is anisotropically etched along its longitudinal direction by means of the RIE technique or wet etching using chemicals, to selectively and partially remove the $Si_3N_4$ film 6 provided above the center portion of the top face 3a of the floating gate electrode 3. In this manner, the surface of the $SiO_2$ film 5 is exposed above the center portion of the top face 3a of the floating gate electrode 3.

Figure 9A:
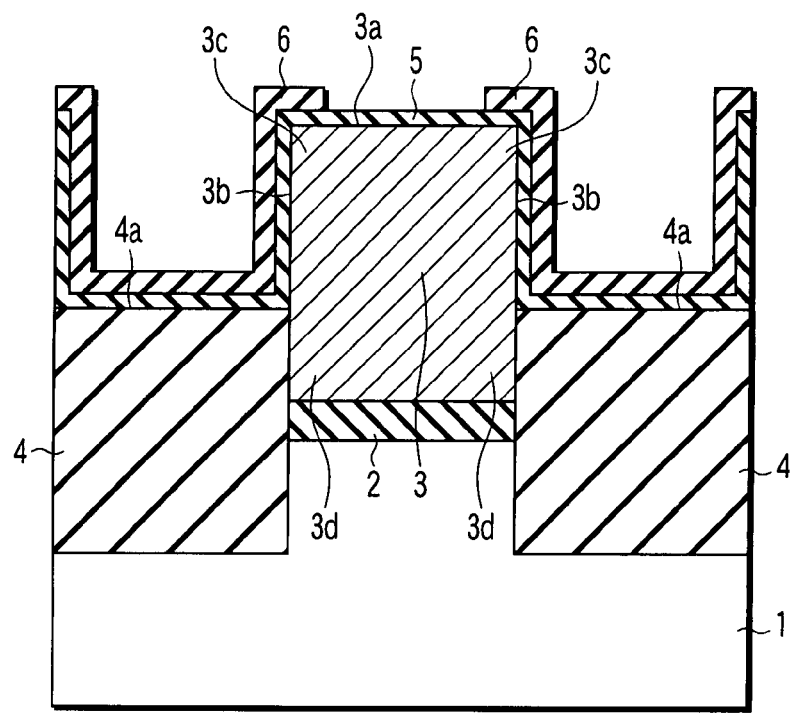
FIGS. 9A and 9B are process sectional views each showing the method for manufacturing a semiconductor device according to the third embodiment.

Next, as shown in FIG. 9A, the resist film 31 is removed from the surface of the $Si_3N_4$ film 6 left on the surface of the $SiO_2$ film 5. As a result, the $Si_3N_4$ film 6 having its substantially uniform film thickness is left on the top face 3a of the flowing gate electrode 3 and each of the upper side faces 3b excluding an upper portion of the center portion of the top face 3a of the floating gate electrode 3. In other words, the $Si_3N_4$ film 6 having its substantially uniform film thickness is selectively and partially left while covering each of the upper corner portions 3c of the floating gate electrode 3.

Figure 9B:
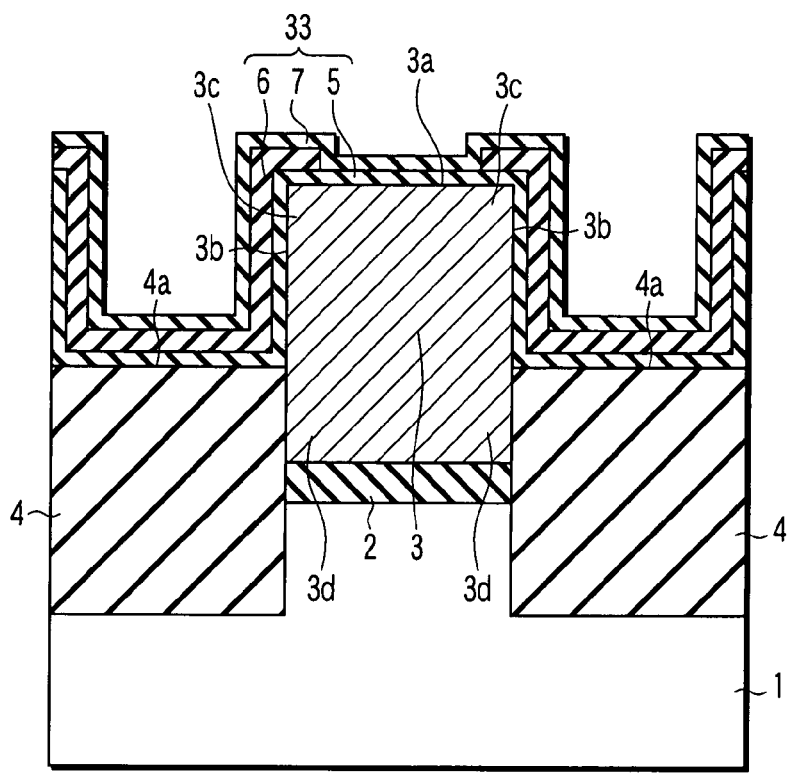

Next, as shown in FIG. 9B, in accordance with the processes similar to those of each of the first and second embodiments, an upper $SiO_2$ film 7 is provided while covering a surface of the $Si_3N_4$ film 6 selectively and partially left on a surface of the lower $SiO_2$ film 5 and a surface of the $SiO_2$ film 5 selectively and partially exposed from the $Si_3N_6$ film 6. This upper $SiO_2$ film 7 is formed such that its entire film thickness becomes substantially uniform, as in each of the first and second embodiments.

In accordance with the processes described above, as shown in FIG. 9B, an inter-poly dielectric film 33 of a three-layered structure, obtained by sandwiching the $Si_3N_4$ film 6 between the lower $SiO_2$ film 5 and the upper $SiO_2$ film 7 excluding an upper portion of the center portion of the top face 3a of the floating gate electrode 3, is formed while covering a surface of each one of the floating gate electrode 3 and the element isolation areas 4. As described above, in the inter-poly dielectric film 33 according to the present embodiment, unlike the inter-poly dielectric films 8 and 21 according to the first and second embodiments, the $Si_3N_4$ film 6 is not provided above the center portion of the top face 3a of the floating gate electrode 3. Therefore, the inter-poly dielectric film 33 according to the present embodiment is formed such that the film thickness in its longitudinal direction is as thin as or thinner than the inter-poly dielectric films 8 and 21 according to the first and second embodiments only on an upper portion of the center portion of the top face 3a of the floating gate electrode 3. In the present embodiment, among the inter-poly dielectric films 33, the film thickness of a portion of a three-layered structure provided on each of the upper side faces 3b and each of the upper corner portions 3c of the floating gate electrode 3 is set at a thickness larger by about 1.2 times or more than that of a portion of a two-layered structure provided on the center portion of the top face 3a of the floating gate electrode 3.

Figure 10:
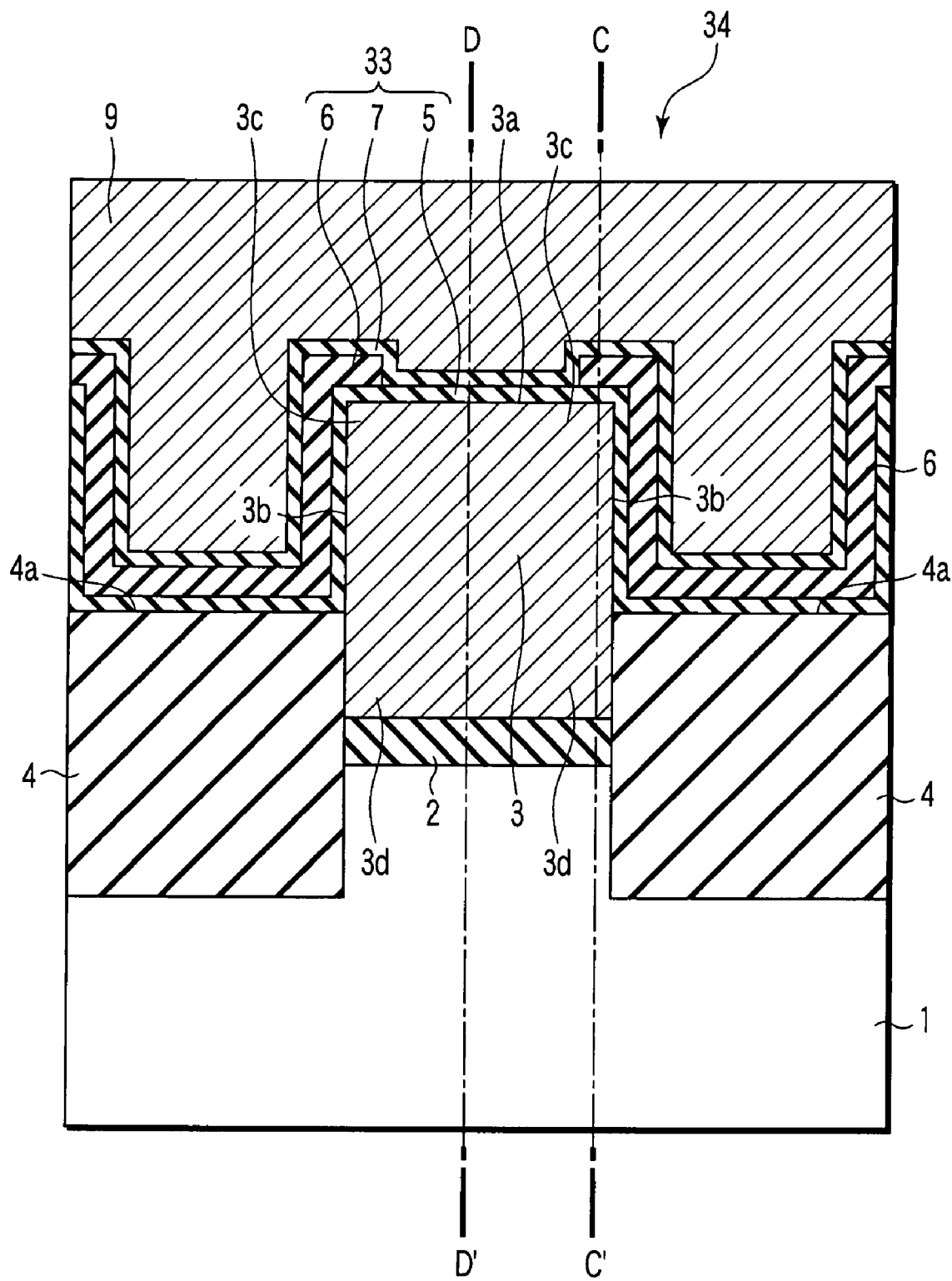
FIG. 10 is a process sectional view showing the method for manufacturing a semiconductor device according to the third embodiment.

Next, as shown in FIG. 10, in accordance with the processes similar to those of each of the first and second embodiments, a control gate electrode 9 is provided on the inter-poly dielectric film 33. In this manner, a three-dimensional capacitor structure 34, obtained by sandwiching an inter-poly dielectric film 33 having a partial ONO structure (three-layered structure) between the floating gate electrode 3 and the control gate electrode 9, is provided on a surface of the silicon wafer 1.

Next, as shown in FIGS. 11 and 12, in accordance with the processes similar to those of the first and second embodiments, source areas 11a and drain areas 11b are formed at a top layer portion of the silicon wafer 1. Concurrently, a plurality of selection gate electrodes 12 are provided on tunnel gate dielectric films 2. The tunnel gate dielectric films 2, the floating gate electrodes 3, the inter-poly dielectric films 33, and the control gate electrodes 9 configure storage transistors 35 together with the source areas 11a and the drain areas 11b. In addition, the storage transistors 35 each configure memory cells 36 together with the selection transistors 14. Then, wires 16 including bit lines 16a and plugs 17 such as contact plugs 17a and via plugs 17b are provided in plurality on the silicon wafer 1. FIG. 11 is a sectional view taken along the broken line C-C' in FIG. 10. Similarly, FIG. 12 is a sectional view taken along the broken line D-D' in FIG. 10.

Although a specific and detailed description together with illustration is not shown, as in the first and second embodiments, a rewritable nonvolatile memory 37 is obtained as a storage-type semiconductor device having a desired structure by executing a predetermined process such as a bonding process or a packaging process. In other words, as shown in FIGS. 10 to 12, a floating gate EEPROM 37 is obtained as having a three-dimensional capacitor structure 34 in which an inter-poly dielectric film (IPD) 33 having a partial ONO structure is provided between each of the floating gate electrodes 3 and each of the control gate electrodes 9. The ONO structure is made of a two-layered structure of the lower $SiO_2$ film 5 and the upper $SiO_2$ film 7 between the center portion of the top face 3a of each of the floating gate electrodes 3 and each of the control gate electrodes 9, and is made of a three-layered structure of the lower $SiO_2$ film 5, the $Si_3N_4$ film 6, and the upper $SiO_2$ film 7 between a portion excluding the center portion of each of the floating gate electrodes 3 and each of the control gate electrodes 9.

As has been described above, according to the third embodiment, an advantageous effect similar to that of each of the first and second embodiments described previously can be attained. In addition, in the present embodiment, unlike each of the first and second embodiments, the film thickness and construction of the inter-poly dielectric film 33 ($Si_3N_4$ film 6) on each of the areas of the upper side faces 3b of the floating gate electrodes 3 and rim portions of the upper faces 3a of the floating electrodes 3 are formed equivalently. In other words, the inter-poly dielectric film 33 ($Si_3N_4$ film 6) according to the present embodiment is formed such that the film thickness of a portion covering an upper portion of each of the upper corner portions 3c of the floating gate electrode 3 is larger in comparison with the inter-poly dielectric films 8 and 21 ($Si_3N_4$ film 6) according to the first and second embodiments. Therefore, in the EEPROM 37 according to the present embodiment, a danger that electric field concentration or a leakage current occurs in the vicinity of each of the upper corner portions 3c of the floating gate electrode 3 is reduced or restrained more remarkably in comparison with the EEPROMs 19 and 25 according to the first and second embodiments, and electrical characteristics are improved more remarkably.

Fourth Embodiment

Now, a fourth embodiment according to the present invention will be described mainly with reference to FIGS. 13A to 15. FIGS. 13A to 15 are process sectional views each showing a method for manufacturing a semiconductor device according to the present embodiment. Like constituent elements in the first to third embodiments described previously are designated by like reference numerals. A detailed description of these constituent elements is omitted here.

In the present embodiment, a $Si_3N_4$ film is further removed laterally of each of the left and right upper side faces of the floating gate electrode excluding each of the left and right upper corner portions of the floating gate electrode as well as, as in the third embodiment, removing the $Si_3N_4$ film from above the center portion of the top face of the floating gate electrode. In this manner, an inter-poly dielectric film is reduced in thickness in each of the longitudinal direction and transverse direction. Now, a specific and detailed description will be given here.

First, from a process for covering a floating gate electrode 3 and each of element isolation areas 4 to a process for providing a SiO$_2$ film 5 as a lower inter-poly dielectric film upwardly of these electrode and area, are similar to the processes described with reference to FIG. 1A in the first embodiment.

Figure 13A:
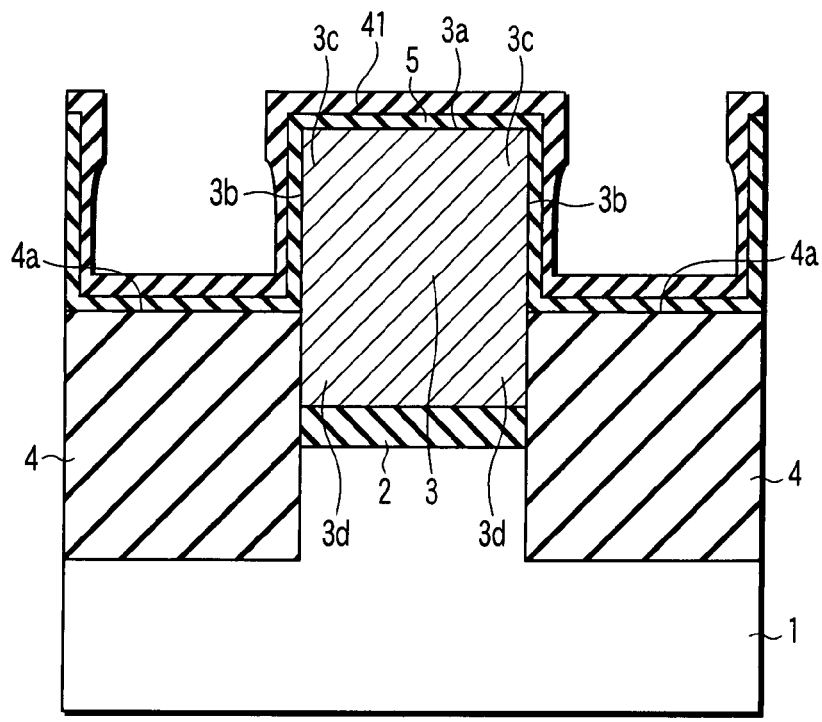
FIGS. 13A and 13B are process sectional views showing a method for manufacturing a semiconductor device according to a fourth embodiment.

Next, as shown in FIG. 13A, a Si$_3$N$_4$ film 41 serving as an intermediate inter-poly dielectric film is provided on a surface of the SiO$_2$ film 5 while its film thickness is partially changed according to its formed position. Specifically, while the film thickness on each of a top face 3a of the floating gate electrode 3, in the vicinity of each of the upper corner portions 3c of the floating gate electrode 3, and on a top face 4a of each of the element isolation areas 4 is larger than that on each of the upper side faces 3b of the floating gate electrode 3 excluding each of the upper corner portions 3c of the floating gate electrode 3, the Si$_3$N$_4$ film 41 is formed on a surface of the SiO$_2$ film 5. Such a structure can be obtained by forming the Si$_3$N$_4$ film 41 with the use of a sputtering technique serving as a type of PVD technique, a plasma CVD technique, or an LPCVD technique in which coverage relative to the SiO$_2$ film 5 is coarse (non-uniform).

In particular, it is preferable that a mixture gas of SiH$_2$Cl$_2$ and NH$_3$ be used as a material gas of the Si$_3$N$_4$ film 41 and that a film forming pressure of the Si$_3$N$_4$ film 41 be set at a pressure higher than usual. By means of such settings, as shown in FIG. 13A, among the area on each of the upper side faces 3b of the floating gate electrode 3, the Si$_3$N$_4$ film 41 having film thickness larger than that of the downward area can be formed in the vicinity of each of the upper corner portions 3c of the floating gate electrode 3.

Figure 13B:
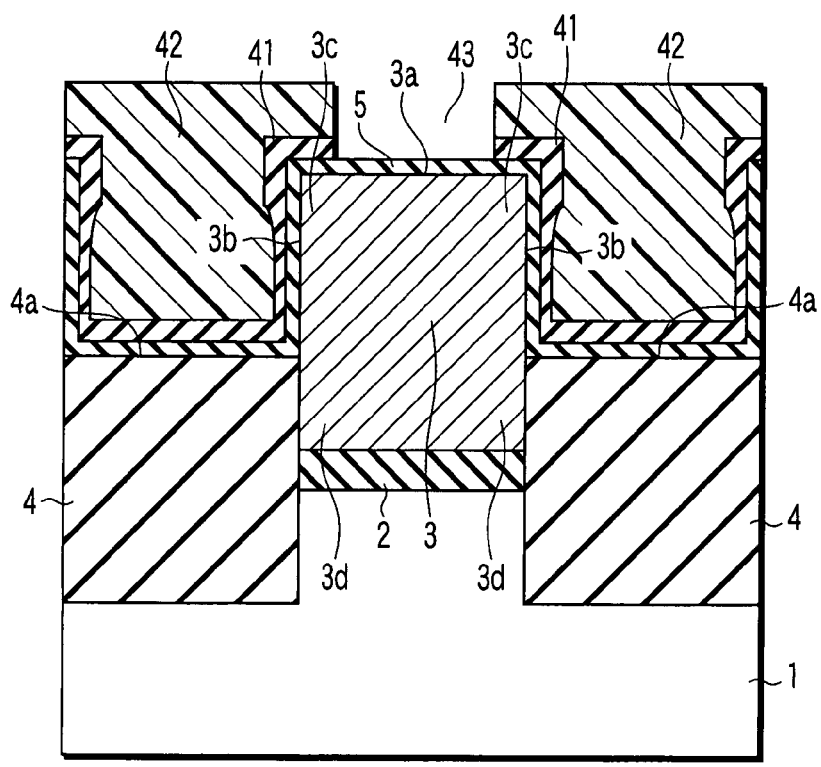

Next, as shown in FIG. 13B, as in the third embodiment, a resist film 42 is provided while covering a surface of the Si$_3$N$_4$ film 41. Then, an opening 43 is formed in the resist film 42 such that a surface of the Si$_3$N$_4$ film 41 provided above the center portion of the top face 3a of the floating gate electrode 3 is exposed. Then, only the Si$_3$N$_4$ film 41 exposed from the opening 43 is etched in an anisotropic manner along its longitudinal direction, and then, the Si$_3$N$_4$ film 41 provided above the center portion of the top face 3a of the floating gate electrode 3 is selectively and partially removed. In this manner, a surface of the SiO$_2$ film 5 provided above the center portion of the top face 3a of the floating gate electrode 3 is exposed.

Next, as shown in FIG. 14A, as in the third embodiment, the resist film 42 is removed from a surface of the Si$_3$N$_4$ film 41 left on a surface of the SiO$_2$ film 5. Then, half etching is selectively and partially applied to the Si$_3$N$_4$ film 41 by executing the RIE technique and a wet etching process using chemicals in combination. In this manner, the Si$_3$N$_4$ film 41 is further selectively and partially removed from the surface of the SiO$_2$ film 5 while the Si$_3$N$_4$ film 41 is controlled so as not to be fully removed from the surface of the SiO$_2$ film 5. Specifically, the Si$_3$N$_4$ film 41 left downwardly of each of the upper corner portions 3c on each of the upper side faces 3b of the floating gate electrode 3, of which film thickness is smaller than that of the Si$_3$N$_4$ film 41 left in the vicinity of each of the upper corner portions 3c of the floating gate electrode 3 and on the top face 4a of each of the element isolation areas 4, is removed from the surface of the SiO$_2$ film 5.

As a result, the Si$_3$N$_4$ film 41 having its substantially uniform film thickness is left while covering the SiO$_2$ film 5, only at the periphery of each of the upper corner portions 3c of the floating gate electrode 3 and above the top face 4a of each of the element isolation areas 4. In other words, the thick Si$_3$N$_4$ film 41 is selectively and partially left while covering the SiO$_2$ film 5, only at the periphery of each of the upper corner portions 3c of the floating gate electrode 3 and at a bottom portion of each of recessed portions 47 formed of the floating gate electrode 3 and each of the element isolation areas 4.

Next, as shown in FIG. 14B, in accordance with the processes similar to those according to each of the first to third embodiments, an upper SiO$_2$ film 7 is provided while covering a surface of the Si$_3$N$_4$ film 41 selectively and partially left on a surface of the lower SiO$_2$ film 5 and the surface of the SiO$_2$ film 5 selectively and partially exposed from the Si$_3$N$_4$ film 41. This upper SiO$_2$ film 7 is formed such that its entire film thickness becomes substantially uniform, as in each of the first to third embodiments.

In accordance with the processes described above, as shown in FIG. 14B, in an upper portion of the center portion of the top face 3a of the floating gate electrode 3 and an area of the upper side faces 3b of the floating gate electrode 3 excluding a lower portion of each of the upper corner portions 3c, an inter-poly dielectric film 44 of a three-layered structure, in which the Si$_3$N$_4$ film 41 is sandwiched between the lower SiO$_2$ film 5 and the upper SiO$_2$ film 7, is formed while covering a surface of each one of the floating gate electrode 3 and the element isolation areas 4. In this manner, in the inter-poly dielectric film 44 according to the present embodiment, unlike the inter-poly dielectric films 8, 21, and 33 according to the first to third embodiments, the Si$_3$N$_4$ film 41 is not provided in an upper portion of the center portion of the top face 3a of the floating gate electrode 3 or a side area of the upper side faces 3b of the floating gate electrode 3 excluding a lower portion of each of the upper corner portions 3c. However, the Si$_3$N$_4$ film 41 is provided above an area excluding a rim portion of the top face 4a of each of the element isolation areas 4, i.e., a bottom portion of a recessed portion 47.

Therefore, the inter-poly dielectric film 44 according to the present embodiment is formed such that the film thickness in the longitudinal direction is equal to or smaller than the inter-poly dielectric films 8, 21, and 33 according to the first to third embodiments in an upper portion of the center portion of the top face 3a of the floating gate electrode 3. In addition, the inter-poly dielectric film 44 according to the present embodiment is formed such that the film thickness in the transverse direction is smaller at the downward portion on each of the upper side faces 3b of the floating gate electrode 3, in comparison with the inter-poly dielectric films 8, 21, and 33 according to the first to third embodiments. In the present embodiment, among the inter-poly dielectric film 44, the film thickness of each of the upper corner portions 3c of the floating gate electrode 3 and a portion of a three-layered structure provided on the top face 4a of each of the element isolation areas 4 is set at a thickness larger by about 1.2 times or more than that of the center portion of the top face 3a of the floating gate electrode 3 and a portion of a two-layered structure provided on the lower portion of each of the upper side faces 3b of the floating gate electrode 3.

Figure 15:
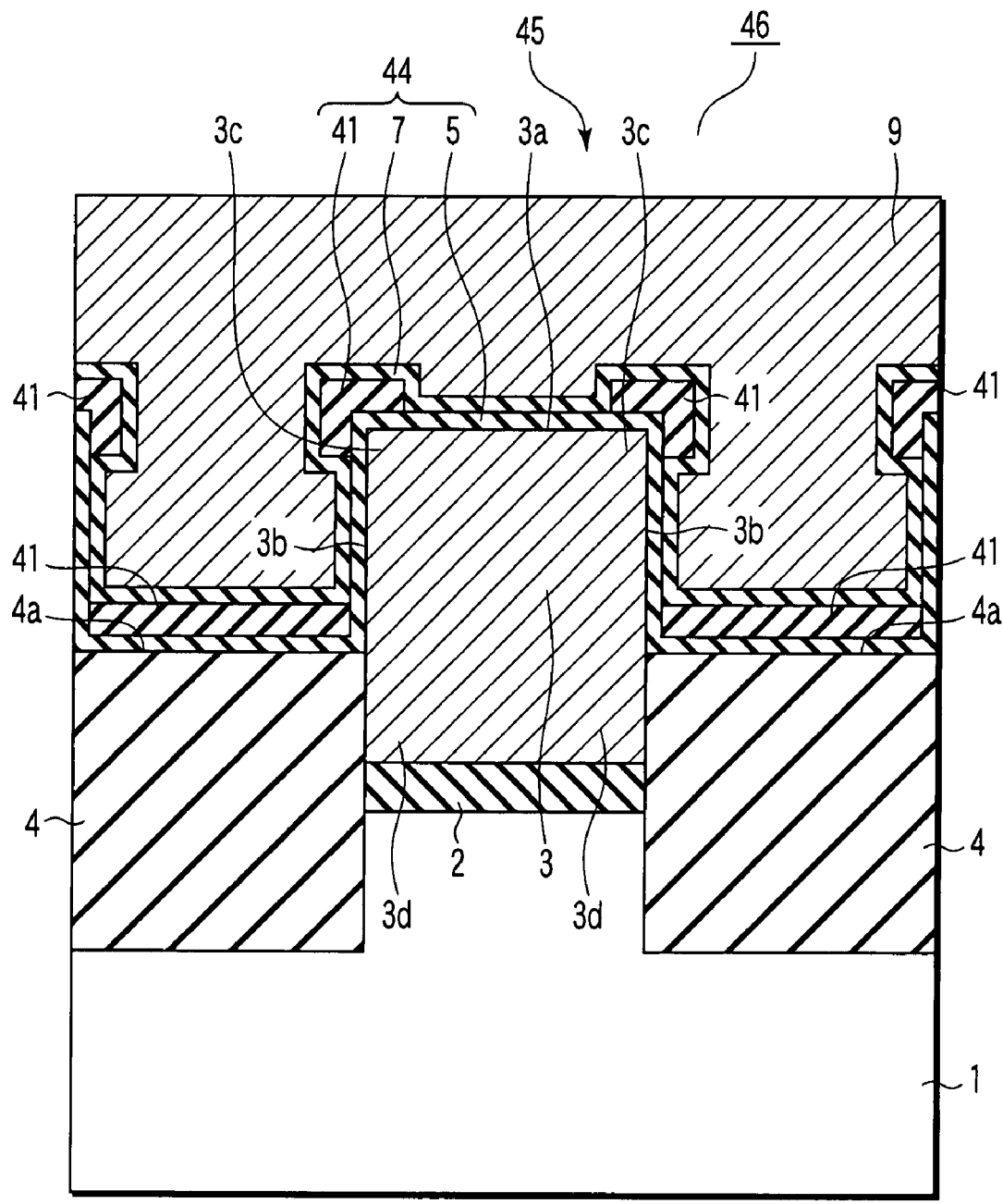
FIG. 15 is a process sectional view showing the method for manufacturing a semiconductor device according to the fourth embodiment.

Next, as shown in FIG. 15, in accordance with the processes similar to each of the first to third embodiments, a control gate electrode 9 is provided on the inter-poly dielectric film 44. In this manner, a three-dimensional capacitor structure 45, obtained by sandwiching the inter-poly dielectric film 44 having a partial ONO structure (three-layered structure) between the floating gate electrode 3 and the control gate electrode 9, is provided on a surface of a silicon wafer 1. A sectional structure in which the vicinity of the floating gate electrode 3 is taken along a vertical direction (longitudinal direction) at its center portion or at a rim portion is similar to that shown in FIG. 11 or 12 referenced in the third embodiment. Thus, these illustrations are not shown in the present embodiment.

Although a specific and detailed description together with illustration is not shown, as in each of the first to third embodiments, a rewritable nonvolatile memory 46 is obtained as a storage-type semiconductor device having a desired structure by executing a predetermined process such as a bonding process or a packaging process. In other words, as shown in FIG. 15, a floating gate EEPROM 46 is obtained as having a three-dimensional capacitor structure 45 in which the inter-poly dielectric film (IPD) 44 having a partial ONO structure is provided between each of the floating gate electrodes 3 and each of the control gate electrode 9. The ONO structure is made of a two-layered structure of the lower $SiO_2$ film 5 and the upper $SiO_2$ film 7 between the center portion of the upper face 3a of the floating gate electrode 3 and each of the control gate electrodes 9 and between an area excluding a lower portion of each of the upper corner portions 3c, among the areas on each of the upper side faces 3b of the floating gate electrode 3, and the control gate electrode 9, and is made of a three-layered structure of the lower $SiO_2$ film 5, the $Si_3N_4$ film 41, and the upper $SiO_2$ film 7 between each of the upper corner portions 3c of the floating gate electrode 0.3 and each of the control gate electrodes 9 and between the top face 4a of each of the element isolation areas 4 and each of the control gate electrodes 9.

As has been described above, according to the fourth embodiment, an advantageous effect similar to that of each of the first to third embodiments described previously can be attained. In addition, in the present embodiment, as in the third embodiment, a thick inter-poly dielectric film 44 ($Si_3N_4$ film 41) is provided in the vicinity of each of the upper corner portions 3c of the floating gate electrode 3. Further, in the present embodiment, the $Si_3N_4$ film 41 is removed laterally of an area excluding a lower portion of each of the upper corner portions 3c among an area on each of the upper side faces 3b of the floating gate electrode 3 as well as, as in the third embodiment, removing the $Si_3N_4$ film 41 from above the center portion of the top face 3a of the floating gate electrode 3. In other words, the inter-poly dielectric film 44 ($Si_3N_4$ film 41) according to the present embodiment, unlike the inter-poly dielectric films 8, 21, and 33 ($Si_3N_4$ film 6) according to the first to third embodiments, is selectively and partially reduced in thickness in each of the longitudinal direction and transverse direction.

Therefore, in the EEPROM 46 according to the present embodiment, a danger that electric field concentration or a leakage current occurs in the vicinity of each of the upper corner portions 3c of the floating gate electrode 3 is reduced or restrained to the same extent as that of the EEPROM 37 according to the third embodiment, and electrical characteristics are improved more remarkably. In addition, the EEPROM 46 according to the present embodiment is made narrower than the EEPROMs 19, 25, and 37 according to the first to third embodiments. In other words, in the EEPROM 46 according to the present embodiment, higher density of integrated circuit (size reduction) and improvement of electrical characteristics are compatible with each other at a higher level, in comparison with the EEPROMs 19, 25, and 37 according to the first to third embodiments.

Fifth Embodiment

Figure 16A:
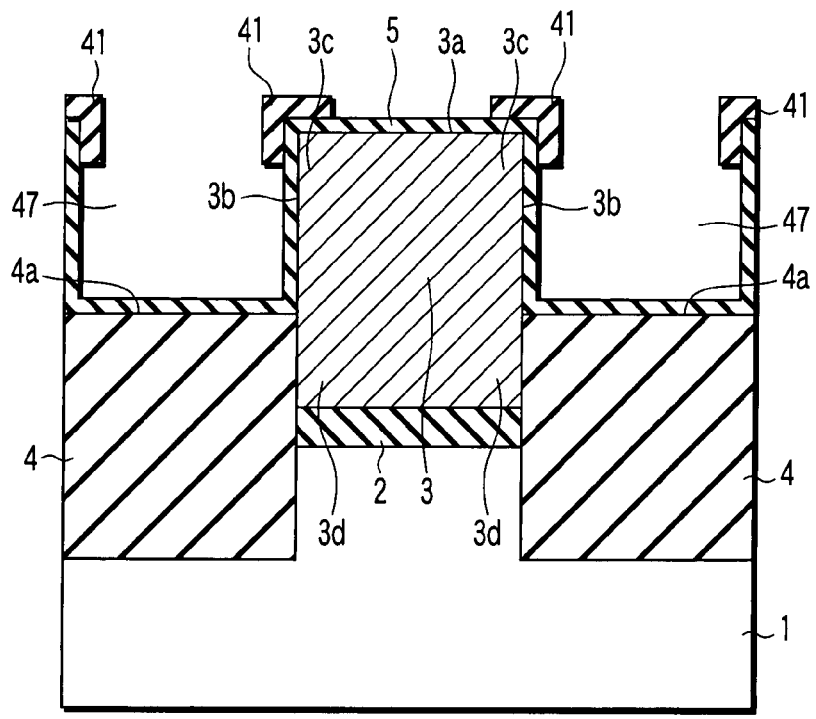
FIGS. 16A and 16B are process sectional views each showing a method for manufacturing a semiconductor device according to a fifth embodiment.

Now, a fifth embodiment according to the present invention will be described mainly with reference to FIGS. 16A, 16B, and 17. FIGS. 16A to 17 are process sectional views each showing a method for manufacturing a semiconductor device according to the present embodiment. Like constituent elements in each of the first to fourth embodiments described previously are designated by like reference numerals. A detailed description of these constituent elements will be omitted here.

In the present embodiment, a $Si_3N_4$ film is further removed from above a top face of an element isolation area as well as, as in the fourth embodiment, removing the $Si_3N_4$ film from an upper portion of a center portion of a top face of a floating gate electrode excluding each of the left and right upper corner portions of the floating gate electrode and from a side portion of each of the left and right upper side faces of the floating gate electrode. In this manner, an inter-poly dielectric film is reduced in thickness in its transverse direction and is further reduced in thickness in its longitudinal direction. Now, a specific and detailed description will be given below.

First, the processes described with reference to FIGS. 13A to 14A in the fourth embodiment are similarly performed up to a process for covering a $SiO_2$ film 5 to selectively and partially leave a thick $Si_3N_4$ film 41 only on each of upper corner portions 3c of a floating gate electrode 3 and on a top face 4a of each of element isolation areas 4.

Next, as shown in FIG. 16A, as in the fourth embodiment, etching is selectively and partially applied to the $Si_3N_4$ film 41 left on a surface of the $SiO_2$ film 5 in combination of the RIE technique and a wet etching process using chemicals. However, in the present embodiment, unlike the fourth embodiment, the $Si_3N_4$ film 41 left on the top face 4a of each of the element isolation areas 4 is also fully removed from the surface of the $SiO_2$ film 5 as well as the $Si_3N_4$ film 41 left downwardly of each of the upper corner portions 3c on each of the upper side faces 3b of the floating gate electrode 3. As a result, a thick $Si_3N_4$ film 41 of which film thickness is substantially uniform is selectively and partially left while covering the $SiO_2$ film 5, only above each of the upper corner portions 3c of the floating gate electrode 3.

Figure 16B:
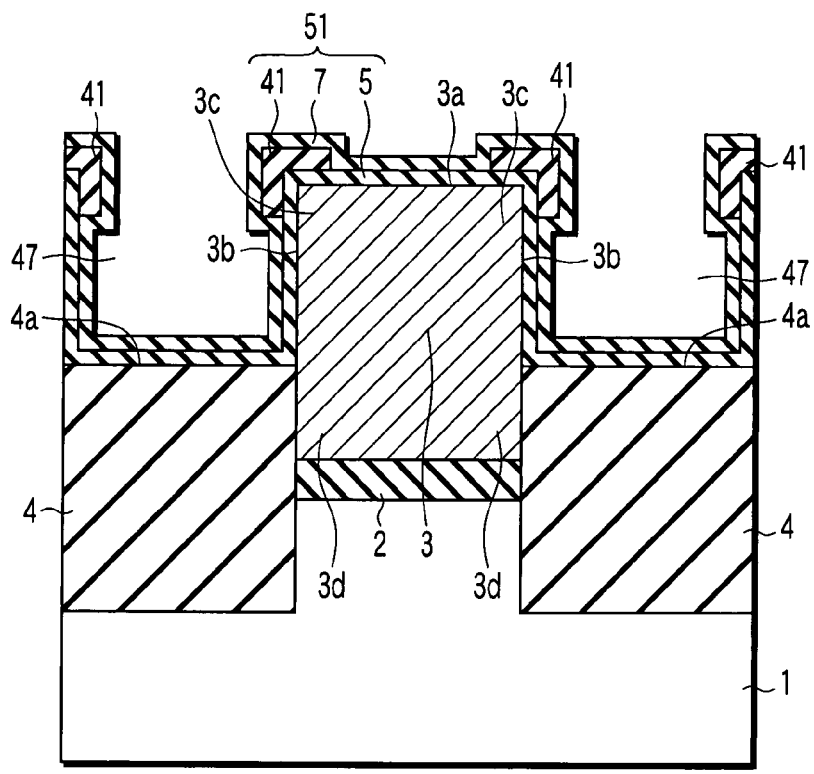
Figure 17:
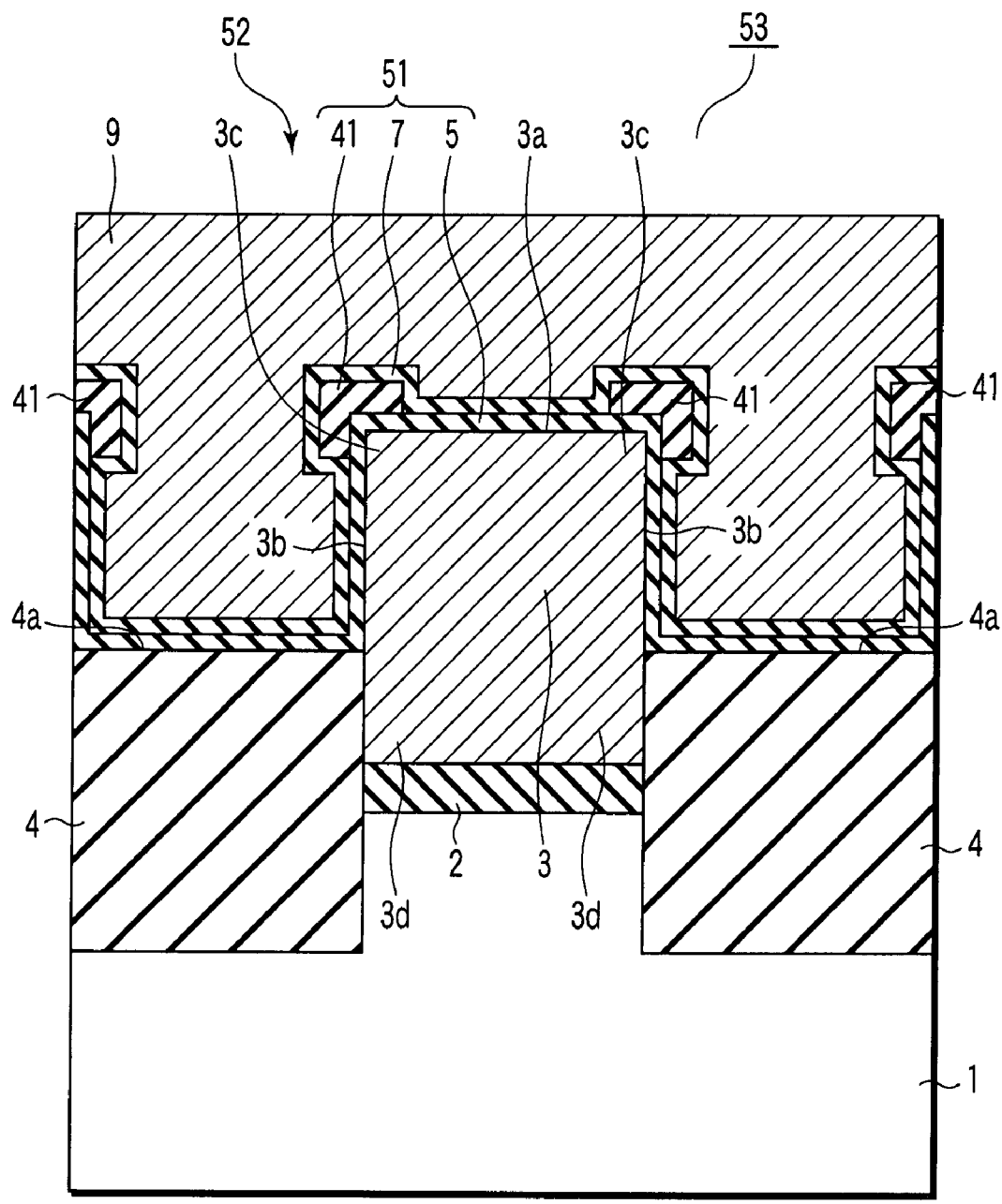
FIG. 17 is a process sectional view showing the method for manufacturing a semiconductor device according to the fifth embodiment.

Next, as shown in FIG. 16B, in accordance with the processes similar to those according to the first to fourth embodiments, an upper $SiO_2$ film 7 is provided while covering a surface of the $Si_3N_4$ film 41 selectively and partially left on the surface of the lower $SiO_2$ film 5 and a surface of the $SiO_2$ film 5 selectively and partially exposed from the $Si_3N_4$ film 41. This upper $SiO_2$ film 7 is formed such that its entire film thickness becomes substantially uniform, as in each of the first to fourth embodiments.

In accordance with the processes described above, as shown in FIG. 16B, an inter-poly dielectric film 51 of a three-layered structure, obtained by sandwiching the $Si_3N_4$ film 41 between the lower $SiO_2$ film 5 and the upper $SiO_2$ film 7 only above each of the upper corner portions 3c of the floating gate electrode 3, is formed while covering a surface of each one of the floating gate electrode 3 and the element isolation areas 4. In this manner, in the inter-poly dielectric film 51 according to the present embodiment, unlike the inter-poly dielectric films 8, 21, 33, and 44 according to the first to fourth embodiments, the $Si_3N_4$ film 41 is provided only above each of the upper corner portions 3c of the floating gate electrode 3.

Therefore, the inter-poly dielectric film 51 according to the present embodiment is formed such that the film thickness in its longitudinal direction is further small above the top face 4a of each of the element isolation areas 4, in comparison with the inter-poly dielectric films 8, 21, 33, and 44 according to the first to fourth embodiments. In addition, the inter-poly dielectric film 51 according to the present embodiment is formed such that the film thickness in its transverse direction is equal to or smaller than the inter-poly dielectric films 8, 21, 33, and 44 according to the first to fourth embodiments in an area excluding each of the upper corner portions of the floating gate electrode 3. In the present embodiment, among the inter-poly dielectric film 51, the film thickness of a portion of a three-layered structure provided on each of the upper corner portions 3c of the floating gate electrode 3 is set at a thickness larger by about 1.2 times or more than that of a portion of a two-layered structure provided on each of the center portion of the upper face 3a of the floating gate electrode 3, the lower portion of each of the upper side faces 3b of the floating gate electrode 3, and the top face 4a of each of the element isolation areas 4.

Next, as shown in FIG. 17, in accordance with the processes similar to those according to each of the first to fourth embodiments, a control gate electrode 9 is provided on the inter-poly dielectric film 51. In this manner, a three-dimensional capacitor structure 52, obtained by sandwiching the inter-poly dielectric film 51 having a partial ONO structure (three-layered structure) between the floating gate electrode 3 and the control gate electrode 9, is provided on a surface of a silicon wafer 1. A sectional structure in which the vicinity of the floating gate electrode 3 is taken along a vertical direction (longitudinal direction) at its center portion or at its rim portion is similar to that shown in FIG. 11 or 12 referenced in the third embodiment. Therefore, these illustrations are not shown in the present embodiment.

Thereafter, although a specific and detailed description together with illustration is not shown, as in each of the first to fourth embodiments, a rewritable nonvolatile memory 53 is obtained as a storage-type semiconductor device having a desired structure, by executing a predetermined process such as a bonding process or a packaging process. In other words, as shown in FIG. 17, a floating gate EEPROM 53 is obtained as having a three-dimensional capacitor structure 52 in which the inter-poly dielectric film (IPD) 51 having a partial ONO structure is provided between each of the floating gate electrodes 3 and each of the control gate electrodes 9. The ONO structure is made of a two-layered structure of the lower $SiO_2$ film 5 and the upper $SiO_2$ film 7 between a portion excluding each of the upper corner portions 3c of the floating gate electrode 3 and each of the control gate electrodes 9, and is made of a three-layered structure of the lower $SiO_2$ film 5, the $Si_3N_4$ film 41, and the upper $SiO_2$ film 7 between each of the upper corner portions 3c of the floating gate electrode 3 and each of the control gate electrodes 9.

As has been described above, according to the fifth embodiment, an advantageous effect similar to that of each of the first to fourth embodiments described previously can be attained. In addition, in the present embodiment, unlike each of the first to fourth embodiments, a thick inter-poly dielectric film 51 ($Si_3N_4$ film 41) is provided only in the vicinity of each of the upper corner portions 3c of the floating gate electrode 3. In other words, the inter-poly dielectric film 51 ($Si_3N_4$ film 41) according to the present embodiment is reduced in thickness in its transverse direction and is further reduced in thickness in its longitudinal direction, unlike the inter-poly dielectric films 8, 21, 33, and 44 ($Si_3N_4$ films 6 and 41) according to the first to fourth embodiments.

Therefore, in the EEPROM 53 according to the present embodiment, a danger that electric field concentration or a leakage current occurs in the vicinity of each of the upper corner portions 3c of the floating gate electrode 3 is reduced or restrained to the same extent as that of the EEPROM 37 according to the third embodiment, and electrical characteristics are improved more remarkably. In addition, the EEPROM 53 according to the present embodiment is made shallower and narrower than the EEPROMs 19, 25, 37, and 46 according to the first to fourth embodiments. In other words, in the EEPROM 53 according to the present embodiment, higher density of integrated circuit (size reduction) and improvement of electrical characteristics are compatible with each other at a higher level, in comparison with the EEPROMs 19, 25, 37, and 46 according to the first to fourth embodiments.

Sixth Embodiment

Figure 19:
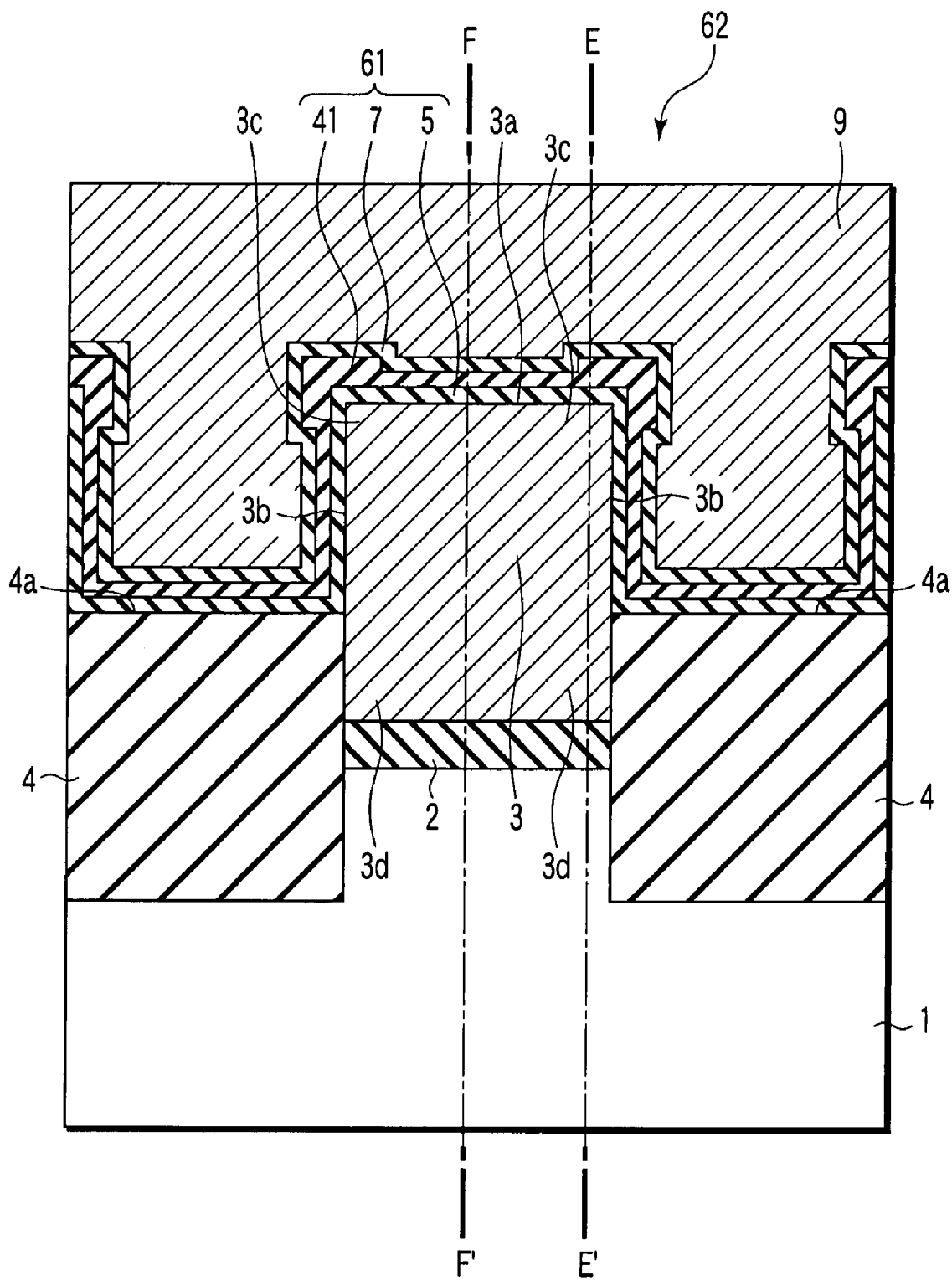
FIG. 19 is a process sectional view showing the method for manufacturing a semiconductor device according to the sixth embodiment.
Figure 20:
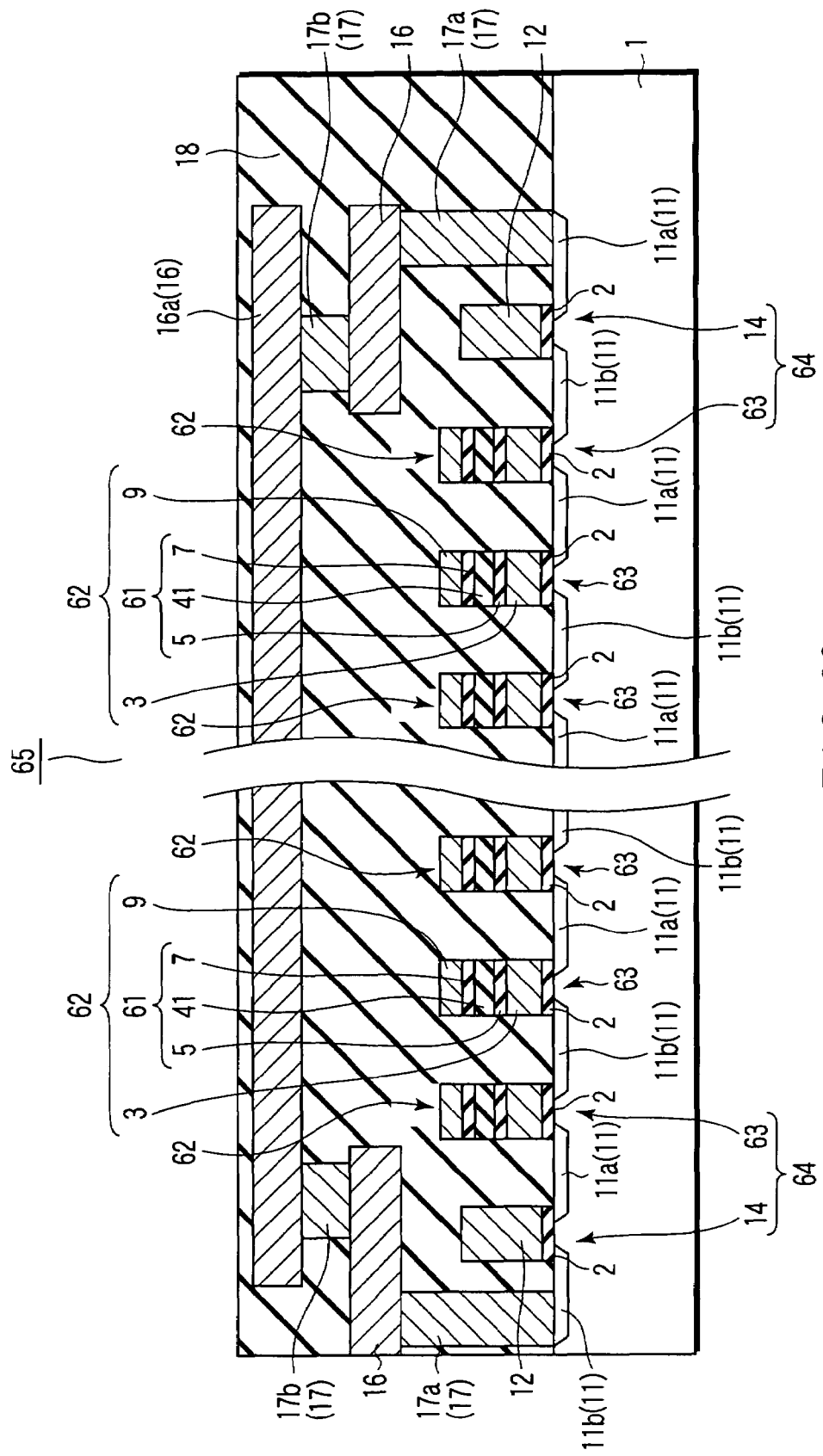
FIG. 20 is a sectional view taken along the broken line E-E' in FIG. 19.
Figure 21:
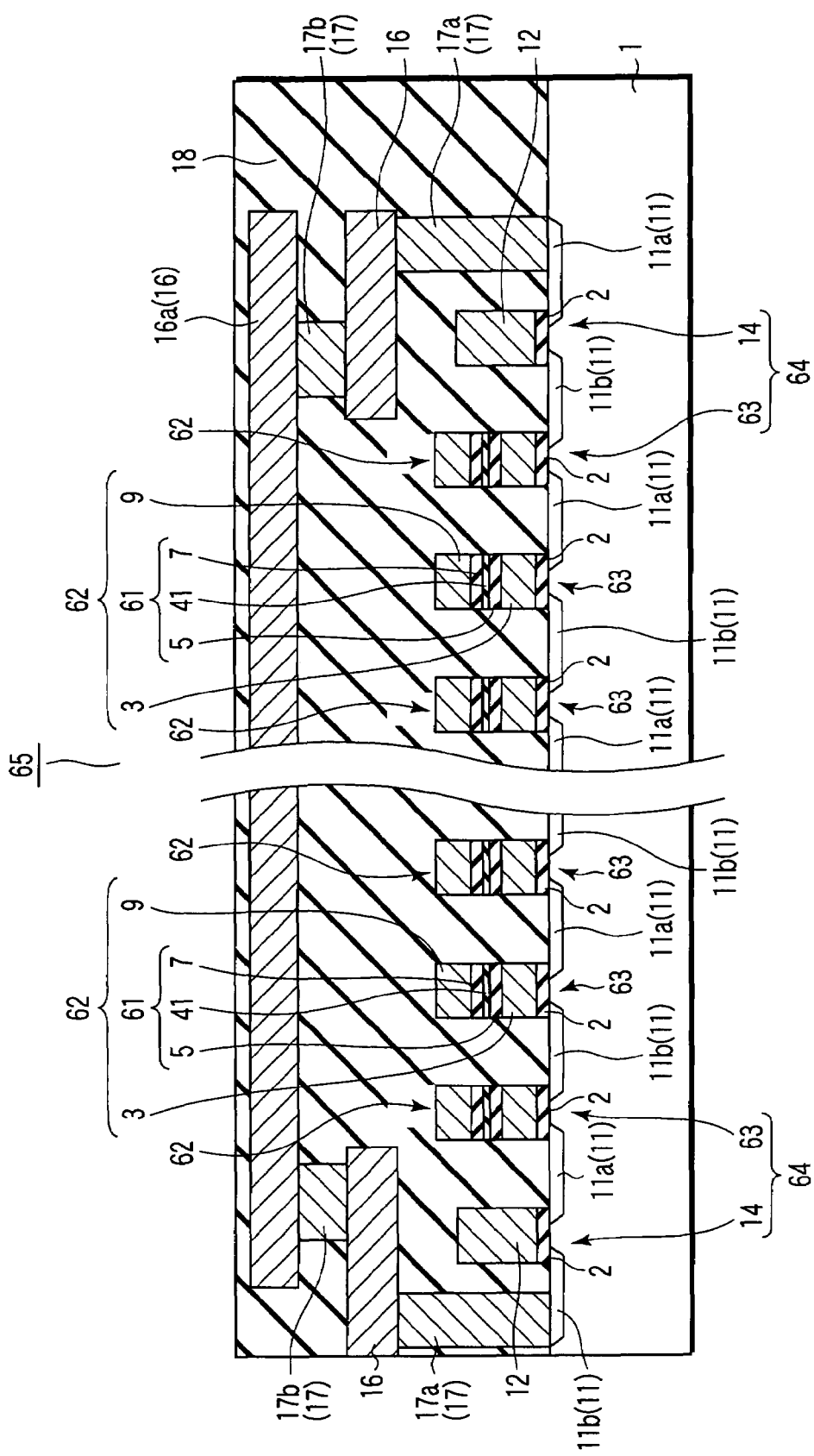
FIG. 21 is a sectional view taken along the broken line F-F' in FIG. 19.

Now, a sixth embodiment according to the present invention will be described mainly with reference to FIGS. 18A to 21. FIGS. 18A, 18B, and 19 are process sectional views each showing a method for manufacturing a semiconductor device according to the present embodiment. FIG. 20 is a sectional view taken along the broken line E-E' in FIG. 19. FIG. 21 is a sectional view taken along the broken line F-F' in FIG. 19. Like constituent elements in the first to fifth embodiments described previously are designated by like reference numerals. A detailed description of these constituent elements is omitted here.

In the present embodiment, unlike the first to fifth embodiments, the film thickness of a $Si_3N_4$ film in the vicinity of each of the upper corner portions of a floating gate electrode is made larger than the film thickness above or laterally of other portions excluding each of the upper corner portions of the floating gate electrode and the film thickness of a $Si_3N_4$ film above each of the element isolation areas, and then, the $Si_3N_4$ film is provided while fully covering the surface of the lower $SiO_2$ film. Now a specific and detailed description will be given below.

First, from a process for providing a resist film 42 while covering a surface of a $Si_3N_4$ film 41 to a process for forming an opening 43 in the resist film 42 above a center portion of an upper face 3a of a floating gate electrode 3, are similar to the processes described with reference to FIGS. 13A and 13B in the fourth embodiment.

Next, as shown in FIG. 18A, in accordance with the processes similar to those of each of the third and fourth embodiments, only a $Si_3N_4$ film 41 exposed from the opening 43 is etched in an anisotropic manner along its longitudinal direction. However, in the present embodiment, unlike each of the third and fourth embodiments, the $Si_3N_4$ film 41 is not fully removed until the surface of the $SiO_2$ film 5 provided above the center portion of the top face 3a of the floating gate electrode 3 is fully exposed on the opening 43. In the present embodiment, only reduction of a film thickness (half etching) by etching is applied to the $Si_3N_4$ film 41 provided above the center portion of the upper face 3a of the floating gate electrode 3. In other words, etching with respect to the $Si_3N_4$ film 41 is stopped at an intermediate portion in its film thickness direction so that the surface of the $SiO_2$ film 5 provided on the center portion of the top face 3a of the floating gate electrode 3 is not exposed while it is covered with the $Si_3N_4$ film 41.

Specifically, etching with respect to the $Si_3N_4$ film 41 is controlled so that the film thickness of the $Si_3N_4$ film 41 above the center portion of the top face 3a of the floating gate electrode 3 after etching has terminated is set at a thickness substantially equal to that of the $Si_3N_4$ film 41 provided downwardly of each of the upper corner portions 3c laterally of each of the upper side faces 3b of the floating gate electrode 3. In this manner, as shown in FIG. 18A, the $Si_3N_4$ film 41 can be formed on the surface of the $SiO_2$ film 5 such that the film thickness near each of the upper corner portions 3c of the floating gate electrode 3 and on the top face 4a of each of the element isolation areas 4 is larger than that of any other portion.

Next, as shown in FIG. 18B, in accordance with the processes similar to each of the fourth and fifth embodiments, a resist film 42 is removed from the surface of the $Si_3N_4$ film 41. Then, in accordance with the process similar to the fifth embodiment, etching is selectively and partially applied to the $Si_3N_4$ film 41 provided above the top face 4a of each of the element isolation areas 4. However, in the present embodiment, unlike the fifth embodiment, the $Si_3N_4$ film 41 is not fully removed from the surface of the $SiO_2$ film 5 until the surface of the $SiO_2$ film provided on the top face 4a of each of the element isolation areas 4 is fully exposed. In the present embodiment, as in etching with respect to the $Si_3N_4$ film 41 above the center portion of the top face 3a of the floating gate electrode 3 described previously, only reduction of a film thickness (half etching) is applied to the $Si_3N_4$ film 41 left on the top face 4a of each of the element isolation areas 4. In other words, etching with respect to the $Si_3N_4$ film 41 is stopped at an intermediate portion so that the surface of the $SiO_2$ film 5 provided on the top face 4a of each of the element isolation areas 4 is not exposed while it is covered with the $Si_3N_4$ film 41.

Specifically, etching with respect to the $Si_3N_4$ film 41 is controlled so that the film thickness of the $Si_3N_4$ film 41 on the top face 4a of each of the element isolation areas 4 after etching has terminated is set at a thickness substantially equal to that of the $Si_3N_4$ film 41 provided downwardly of each of the upper corner portions 3c laterally of each of the upper side faces 3b of the floating gate electrode 3. In this manner, as shown in FIG. 18B, the $Si_3N_4$ film 41 can be formed on the surface of the $SiO_2$ film 5 such that the film thickness of the periphery of each of the upper corner portions 3c of the floating gate electrode 3 is formed to be larger than that of any other portion.

Next, as shown in FIG. 19, in accordance with the processes similar to each of the first to fifth embodiments, an upper $SiO_2$ film 7 is provided while covering the surface of the $Si_3N_4$ film 41. This upper $SiO_2$ film 7 is formed such that its entire film thickness becomes substantially uniform, as in each of the first to fifth embodiments. In accordance with the processes described above, as shown in FIG. 19, an inter-poly dielectric film 61 of a three-layered structure, obtained when a $Si_3N_4$ 41 of which the film thickness near each of the upper corner portions 3c of the floating gate electrode 3 is larger than that of any other portion is sandwiched between the lower $SiO_2$ film 5 and the upper $SiO_2$ film 7, is formed while covering a surface of each one of the floating gate electrode 3 and the element isolation areas 4.

In the present embodiment, among the inter-poly dielectric film 61, the film thickness of a portion provided on each of the upper corner portions 3c of the floating gate electrode 3 is set at a thickness larger by about 1.2 times or more than that of each of a portion provided on the center portion of the upper face 3a of the floating gate electrode 3, at the lower portion of each of the upper side faces 3b of the floating gate electrode 3, and at a portion provided on the top face 4a of each of the element isolation areas 4. At this time, as described in the first embodiment, the film thickness of each one of the lower $SiO_2$ film 5, the $Si_3N_4$ film 41, and the upper $SiO_2$ film 7 is set in proper size as required such that the film thickness of a thick portion of the inter-poly dielectric film 61 is set at a thickness larger by about 1.2 times or more than that of a thin portion of the inter-poly dielectric film 61. In particular, it is important to properly set the film thickness of the thick portion of the $Si_3N_4$ film 41 and the film thickness of the thin portion of the $Si_3N_4$ film 41 at proper values such that the film thickness of a thick portion of the inter-poly dielectric film 61 is set at a thickness larger by about 1.2 times or more than that of the thin portion of the inter-poly dielectric film 61.

Then, as shown in FIG. 19, in accordance with the processes similar to each of the first to fifth embodiments, a control gate electrode 9 is provided on the inter-poly dielectric film 61. In this manner, a three-dimensional capacitor structure 62, obtained by sandwiching the inter-poly dielectric film 61 having an ONO structure (three-layered structure) of which film thicknesses are partially different from each other, between the floating gate electrode 3 and the control gate electrode 9, is provided on the surface of the silicon wafer 1.

Next, as shown in FIGS. 20 and 21, in accordance with the processes similar to each of the first to fifth embodiments, source areas 11a or drain areas 11b are formed on a top layer portion of the silicon wafer 1. In addition, a plurality of selection gate electrodes 12 are provided on tunnel gate dielectric films 2. The tunnel gate dielectric films 2, the floating gate electrodes 3, the inter-poly dielectric films 61, and the control gate electrodes 9 configure storage transistors 63 together with the source areas 11a and the drain areas 11b. Then, the storage transistors 63 each configure memory cells 64 together with the selection transistors 14. Then, wires 16 including bit lines 16a and plugs 17 such as contact plugs 17a and via plugs 17b are provided in plurality on the silicon wafer 1. FIG. 20 is a sectional view taken along the broken line E-E' in FIG. 19. Similarly, FIG. 21 is a sectional view taken along the broken line F-F' in FIG. 19.

Then, although a specific and detailed description together with illustration is not shown, as in each of the firth to fourth embodiments, a rewritable nonvolatile memory 65 is obtained as a storage-type semiconductor device having a desired structure by executing a predetermined process such as a bonding process or a packaging process. In other words, as shown in FIGS. 19 to 21, a floating gate EEPROM 65 is obtained as having a three-dimensional capacitor structure 62, in which an inter-poly dielectric film (IPD) 61 having an ONO structure (three-layered structure) is provided between each of the floating gate electrodes 3 and each of the control gate electrode 9. The ONO structure is obtained by sandwiching a $Si_3N_4$ film 41 of which film thickness near each of the upper corner portions 3c of the floating gate electrode 3 is larger than that of any other portion, between the lower $SiO_2$ film 5 and the upper $SiO_2$ film 7.

As has been described above, according to the sixth embodiment, an advantageous effect similar to that of each of the first to fifth embodiments described previously can be attained. In addition, in the EEPROM 65 according to the present embodiment, unlike the EEPROMs 25, 37, 46, and 53 according to each of the second to fifth embodiments, the $Si_3N_4$ film 41 is fully provided while covering the floating gate electrode 3 and the top face 4a of each of the element isolation areas 4, as in the EEPROM 19 according to the first embodiment. Thus, in the EEPROM 65 according to the present embodiment, a danger that electric field concentration or a leakage current occurs at the periphery of the floating gate electrode 3 is reduced or restrained to the same extent as that of the EEPROM 19 according to the first embodiment and electric characteristics are improved more remarkably. In particular, in the EEPROM 65 according to the present embodiment, a thick $Si_3N_4$ film 41 is provided while covering each of the upper corner portions 3c of the floating gate electrode 3 and a thin $Si_3N_4$ film 41 is provided while covering any other portion excluding each of the upper corner portions 3c of the floating gate electrode 3 and the top face 4a of each of the element isolation areas 4. Therefore, in the EEPROM 65 according to the present embodiment, the electrical characteristics in the vicinity of each of the upper corner portions 3c of the floating gate electrode 3 are extremely improved.

Seventh Embodiment

Figure 22:
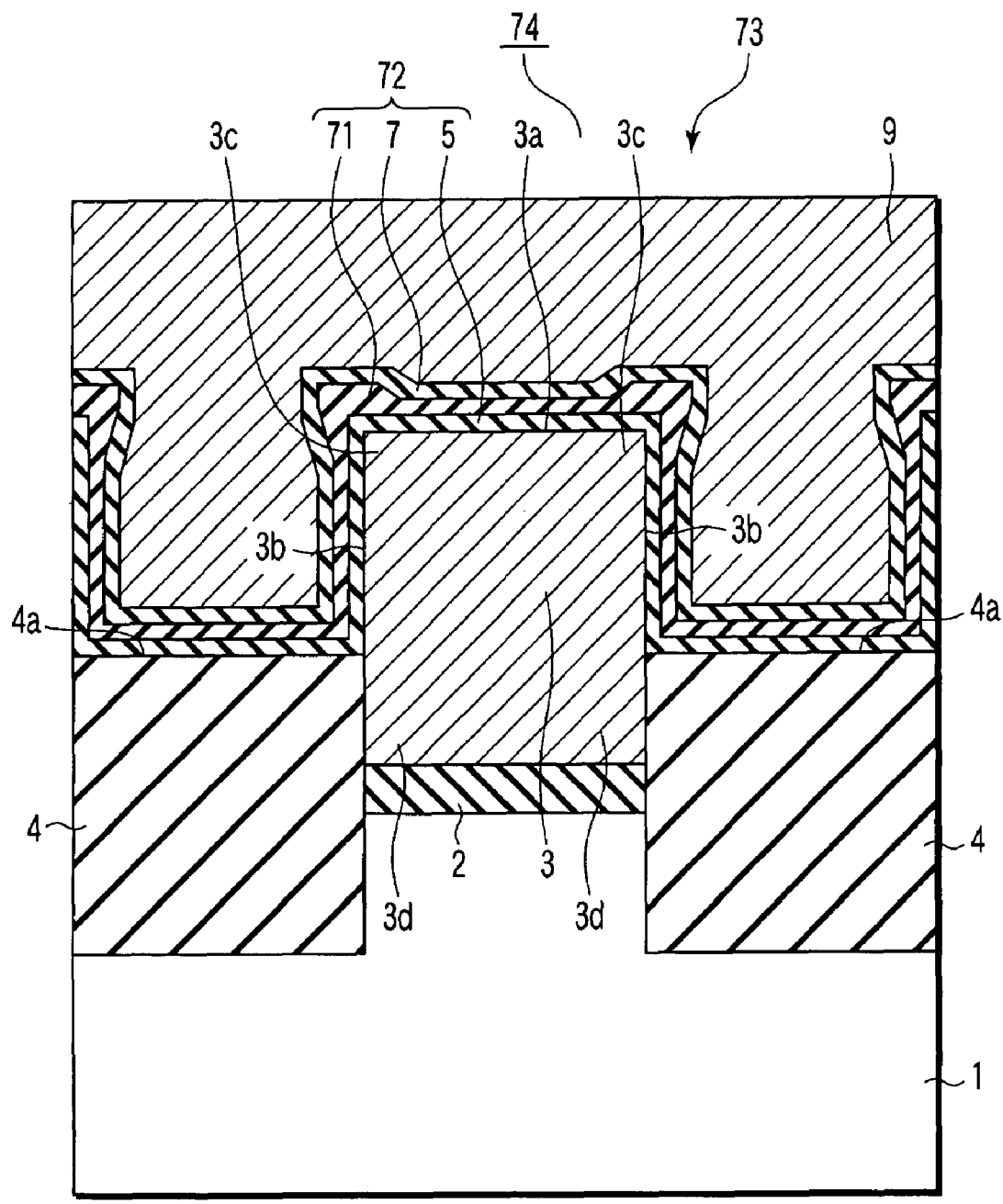
FIG. 22 is a sectional view showing a semiconductor device according to a seventh embodiment.

Now, a seventh embodiment according to the present invention will be described mainly with reference to FIG. 22. FIG. 22 is a sectional view showing a semiconductor device according to the present embodiment. Like constituent elements in the first to sixth embodiments described previously are designated by like reference numerals. A detailed description of these constituent elements is omitted here.

In the present embodiment, as in the sixth embodiment, the film thickness in the vicinity of each of the upper corner portions of a floating gate electrode is made larger than that above or laterally of any other portion excluding each of the upper corner portions of the floating gate electrode and that above each of the element isolation areas, and then, a $Si_3N_4$ film is formed. However, unlike the sixth embodiment, a change of film thickness of the $Si_3N_4$ film is set more gently. Now, a brief description will be given below.

First, from a process for covering a floating gate electrode 3 and each of element isolation areas 4 to a process for providing a lower $SiO_2$ film 5 above these electrode and area, is similar to the processes described with reference to FIG. 1A in the first embodiment.

Next, as shown in FIG. 22, a $Si_3N_4$ film 71 is provided on a surface of the $SiO_2$ film 5. At this time, the $Si_3N_4$ film 71 is formed in accordance with a combination of a sputtering technique, a supply rate-determining chemical vapor deposition technique, and an etching process or in accordance with a lithography process or the like. Then, as shown in FIG. 22, the $Si_3N_4$ film 71 of which film thickness near each of the upper corner portions 3c of the floating gate electrode 3 is larger than that of any other portion can be formed on a surface of the $SiO_2$ film 5. In particular, unlike the $Si_3N_4$ film 41 according to the sixth embodiment, the $Si_3N_4$ film 71 of which film thickness is gradually smaller from the vicinity of each of the upper corner portions 3c of the floating gate electrode 3 toward the center portion of the top face 3a of the floating gate electrode 3, can be formed on the surface of the $SiO_2$ film 5. Similarly, the $Si_3N_4$ film 71 of which film thickness is gradually smaller from the vicinity of each of the upper side corner portions 3c of the floating gate electrode 3 toward a lower portion of each of the upper side faces 3b of the floating gate electrode 3, can be formed on the surface of the $SiO_2$ film 5. It is preferable that the film thickness of a thin portion of the $Si_3N_4$ film 71 be set in substantially uniform size regardless of its forming position.

Next, as shown in FIG. 22, in accordance with the processes similar to each of the first to sixth embodiments, an upper $SiO_2$ film 7 is provided while covering a surface of the $Si_3N_4$ film 71. This upper $SiO_2$ film 7 is formed such that its entire film thickness becomes substantially uniform, as in each of the first to sixth embodiments. In accordance with the processes described above, as shown in FIG. 22, an inter-poly dielectric film 72 of a three-layered structure, obtained when the $Si_3N_4$ film 71 of which film thickness is gradually larger from the center portion of the top face 3a of the floating gate electrode 3 or a lower portion of each of the upper side faces 3b of the floating gate electrode 3 toward each of the upper corner portions 3c of the floating gate electrode 3 is sandwiched between the lower $SiO_2$ film 5 and the upper $SiO_2$ film 7, is formed while covering a surface of each one of the floating gate electrode 3 and the element isolation areas 4.

In an inter-poly dielectric film 72 according to the present embodiment, as in the inter-poly dielectric film 61 according to the sixth embodiment, the film thickness of a portion provided on each of the upper corner portions 3c of the floating gate electrode 3 is set at a thickness larger by about 1.2 times or more than that of the center portion of the top face 3a of the floating gate electrode 3, the lower portion of each of the upper side faces 3b of the floating gate electrode 3, and the top face 4a of each of the element isolation areas 4. At this time, as described in each of the first and sixth embodiments, the film thickness of each one of the lower $SiO_2$ film 5, the $Si_3N_4$ film 71, and the upper $SiO_2$ film 7 is set in proper size as required such that the film thickness of a thick portion of the inter-poly dielectric film 72 is set at a thickness larger by about 1.2 times or more than that of a thin portion of the inter-poly dielectric film 72. In particular, it is important to set the film thickness of the thick portion of the $Si_3N_4$ film 71 and the film thickness of the thin portion of the $Si_3N_4$ film 71 in proper size as required such that the film thickness of the thick portion of the inter-poly dielectric film 72 is set at a thickness larger by about 1.2 times or more than that of the thin portion of the inter-poly dielectric film 72.

Then, as shown in FIG. 22, in accordance with the processes similar to each of the first to sixth embodiments, a control gate electrode 9 is provided on the inter-poly dielectric film 72. In this manner, a three-dimensional capacitor structure 73, obtained by sandwiching the inter-poly dielectric film 72 having an ONO structure (three-layered structure) of which film thickness changes gently depending on each portion, between the floating gate electrode 3 and the control gate electrode 9, is provided on a surface of a silicon wafer 1. A sectional structure in which the vicinity of the floating gate electrode 3 is taken along a vertical direction (longitudinal direction) at its center portion or at its rim portion is substantially similar to that shown in FIG. 20 or 21 referenced in the sixth embodiment. Therefore, their illustrations are not shown in the present embodiment.

Then, although a specific and detailed description together with illustration is not shown, as in each of the first to sixth embodiments, a rewritable nonvolatile memory 74 is obtained as a storage-type semiconductor device having a desired structure by executing a predetermined process such as a bonding process or a packaging process. In other words, as shown in FIG. 22, a floating gate EEPROM 74 is obtained as having a three-dimensional capacitor structure 73 in which an inter-poly dielectric film (IPD) 72 having an ONO structure (three-layered structure) is provided between each of the floating gate electrodes 3 and each of the control gate electrodes 9. The ONO structure is obtained when a $Si_3N_4$ film 71 of which film thickness is gradually larger from the center portion of the top face 3a of the floating gate electrode 3 or a lower portion of each of the upper side faces 3b of the floating gate electrode 3 toward each of the upper corner portions 3c of the floating gate electrode 3 is sandwiched between the lower $SiO_2$ film 5 and the upper $SiO_2$ film 7.

As has been described above, according to the seventh embodiment, an advantageous effect similar to that of the sixth embodiment described previously can be attained.

A semiconductor device and a method for manufacturing the device according to the present invention are not limited to each of the first to seventh embodiments described previously. The inventive device and method can be carried out by modifying part of their configuration or manufacturing process to a variety of settings or by using a variety of settings in proper combination as required.

For example, in each of the first to seventh embodiments, although the inter-poly dielectric films 8, 21, 33, 44, 51, 61, and 72 made of an ONO structure in which two types of dielectric films of the $SiO_2$ films 5 and 7 and the $Si_3N_4$ films 6, 41, and 71 are alternately laminated in a three-layered manner were used, the present invention is not limited thereto. The inter-poly dielectric film may be composed of one type (one layer) of dielectric film, for example. Alternatively, the inter-poly dielectric film may be configured so that three types or more of dielectric films are laminated in four layers or more, as in the inter-poly dielectric films 8, 21, 33, 44, 51, 61, and 72, for example. In other words, with respect to the inter-poly dielectric films, types or the number of layers of dielectric films configuring it may be set in proper number as required.

Specifically, in the case where an inter-poly dielectric film is configured so that oxide films (layers) and nitride films (layers) are alternately laminated as in the inter-poly dielectric films 8, 21, 33, 44, 51, 61, and 72, the following configuration may be provided. For example, in the case where oxide films and nitride films are alternately laminated in a four-layered manner to configure an inter-poly dielectric film, a $Si_3N_4$ film, a $SiO_2$ film, a $Si_3N_4$ film, and a $SiO_2$ film may be laminated in this order from the lowest layer side. Such a structure is generally abbreviated as a NONO structure. Alternatively, a $SiO_2$ film, a $Si_3N_4$ film, a $SiO_2$ film, and a $Si_3N_4$ film may be laminated in this order from the lowest layer side. Such a structure is generally abbreviated as an ONON structure. In addition, in the case where oxide films and nitride films are alternately laminated in a five-layered manner to configure an inter-poly dielectric film, a $Si_3N_4$ film, a $SiO_2$ film, a $Si_3N_4$ film, a $SiO_2$ film, and a $Si_3N_4$ film may be laminated in this order from the lowest layer side. Such a structure is generally abbreviated as a NONON structure. In the case where the inter-poly dielectric film is structured in a five-layered manner, of course, the film may be provided as an ONONO structure. Further, in the case where an inter-poly dielectric film is structured in a seven-layered manner, of course, the film may be provided as a NONONON structure or an ONONONO structure.

In addition, in each of the first to seventh embodiments, in order to selectively and partially change the entire film thickness of the inter-poly dielectric films 8, 21, 33, 44, 51, 61, and 72, the thickness of each of the $Si_3N_4$ films 6, 41, and 71 serving as an intermediate (second) inter-poly dielectric film was selectively and partially changed or the $Si_3N_4$ films 6, 41, and 71 were selectively and partially removed. However, a method for selectively and partially changing the entire film thickness of each of the inter-poly dielectric films 8, 21, 33, 44, 51, 61, and 72 is not limited thereto. For example, the entire film thickness of each of the inter-poly dielectric films 8, 21, 33, 44, 51, 61, and 72 may be selectively and partially changed by selectively and partially changing film thickness of the $SiO_2$ film 5 serving as a lower (first) inter-poly dielectric film or the $SiO_2$ film 7 serving as an upper (third) inter-poly dielectric film. Alternatively, the entire film thickness of each of the inter-poly dielectric films 8, 21, 33, 44, 51, and 72 may be selectively and partially changed by selectively and partially removing the $SiO_2$ films 5 and 7.

Specifically, in the case where an inter-poly dielectric film is provided as a NONO structure, the film thickness of the entire inter-poly dielectric film may be selectively and partially changed by selectively and partially changing the film thickness of the third $Si_3N_4$ film. Alternatively, in the case where an inter-poly dielectric film is provided as an ONONO structure, the film thickness of the entire inter-poly dielectric film may be selectively and partially changed by selectively and partially changing the film thickness of the third $SiO_2$ film. In other words, the film thickness of the entire inter-poly dielectric film may be selectively and partially changed by selectively and partially setting the film thickness of at least one of the films configuring it in proper size as required.

In addition, in the fourth embodiment, although the $Si_3N_4$ film 41 serving as an intermediate inter-poly dielectric film was formed by using a mixture gas of $SiH_2Cl_2$ and $NH_3$ as a material gas, a method for forming the $Si_3N_4$ film 41 is not limited thereto. For example, even if the mixture gas of $SiH_4$ and $NH_4$ is used as a material gas, the $Si_3N_4$ film 41 can be formed while a portion in the vicinity of each of the upper corner portions 3c of the floating gate electrode 3 is formed to be thicker than its lower portion as shown in FIG. 13A.

Further, in each of the first to seventh embodiments, although a silicon oxide film was expressed as $SiO_2$ and a silicon nitride film was expressed as $Si_3N_4$, there is no need for the silicon oxide film and the silicon nitride film to be always precisely expressed as $SiO_2$ or $Si_3N_4$ in their stoichiometry. Even if the stoichiometry of the silicon oxide film and the silicon nitride film slightly deviates from expression of $SiO_2$ or $Si_3N_4$, an advantageous effect similar to those of the $SiO_2$ films 5 and 7 and the $Si_3N_4$ films 6, 41, and 71 can be attained.

Furthermore, in each of the first to seventh embodiments, although the inter-poly dielectric films 8, 21, 33, 44, 51, 61, and 72 were used as consisting of an ONO structure in which two types of dielectric films of the $SiO_2$ films 5 and 7 and the $Si_3N_4$ films 6, 41, and 71 were alternately laminated in a three-layered manner, the present invention is not limited thereto. For example, even if a so-called dielectric with a high dielectric constant film such as a tantalum oxide or a hafnium oxide is used instead of the $Si_3N_4$ films 6, 41, and 71 as an intermediate (second) inter-poly dielectric film, an advantageous effect similar to that of the $Si_3N_4$ films 6, 41, and 71 can be attained.

Still furthermore, in each of the first to seventh embodiments, although the inter-poly dielectric films 8, 21, 33, 41, 51, 61, and 72 were configured by using the $SiO_2$ films 5 and 7 and the $Si_3N_4$ films 6, 41, and 71 of which dielectric constant is medium, the present invention is not limited thereto. Of course, a high dielectric constant film of which dielectric constant is equal to or larger than 9 may be used as at least one of the dielectric films configuring the inter-poly dielectric films 8, 21, 33, 44, 51, 61, and 72. The high dielectric constant film is included in an inter-poly dielectric film, whereby, while size reduction of the capacitors 10, 22, 34, 45, 52, 62, and 73 in each of the first to seventh embodiments is enabled, their capacitance can be increased. In other words, the size reduction of the capacitors 10, 22, 34, 45, 52, 62, and 73 and improvement of electrical characteristics can be compatible with each other at a further high level. As a result, the higher density of integrated circuit (size reduction) of the floating gate EEPROMs 19, 25, 37, 46, 53, 65, and 74 can be compatible with each other at a further high level.

Yet furthermore, in the case where a high dielectric constant film is included in an inter-poly dielectric film, of course, the film thickness of the entire inter-poly dielectric film may be selectively and partially changed by selectively and partially setting the film thickness of the high dielectric constant film in proper size as required. However, it is preferable to form the high dielectric constant film to be thicker than any other dielectric film. In this manner, also at a thinly formed portion among the entire inter-poly dielectric film, a danger that the capacitance of a capacitor is reduced can be restrained.

Further, in each of the fourth to sixth embodiments, a method for providing the $Si_3N_4$ film 41 on a surface of the $SiO_2$ film 5 is not limited to the sputtering technique, the plasma CVD technique or the LPCVD technique described previously. Of course, the $Si_3N_4$ film 41, as in the $Si_3N_4$ film 71 according to the seventh embodiment, for example, may be formed as a film on a surface of the $SiO_2$ film 5 in accordance with a combination of a supply rate-determining chemical vapor deposition technique and an etching process, or alternatively, in accordance with a lithography process or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a gate dielectric film provided on at least one site on a surface of a semiconductor substrate;
    at least one first gate electrode provided on the gate dielectric film;
    an inter-electrode dielectric film provided while covering a surface of the first gate electrode, at least partial film thickness of a portion covering a portion other than a corner portion that does not come into contact with the gate dielectric film from among a plurality of corner portions of the first gate electrode being formed to be smaller than at least partial film thickness of a portion covering the corner portion that does not come into contact with the gate dielectric film; and
    a second gate electrode provided while covering a surface of the inter-electrode dielectric film.

2. The device according to claim 1, wherein the inter-electrode dielectric film is formed such that film thickness of a portion provided on a top face of the first gate electrode is smaller than film thickness of a portion provided on a side face of the first gate electrode.

3. The device according to claim 1, wherein the inter-electrode dielectric film is formed such that film thickness of a portion covering the corner portion that does not come into contact with the gate dielectric film of the first gate electrode on a top face of the first gate electrode is smaller than film thickness of a portion covering the corner portion that does not come into contact with the gate dielectric film of the first gate electrode on a side face of the first gate electrode.

4. The device according to claim 1, wherein the inter-electrode dielectric film is formed such that, among a top face of the first gate electrode, film thickness of a portion provided on an area excluding the corner portion that does not come into contact with the gate dielectric film of the first gate electrode is smaller than film thickness of any other portion.

5. The device according to claim 1, wherein the inter-electrode dielectric film is formed such that film thickness of a portion covering the corner portion that does not come into contact with the gate dielectric film of the first gate electrode is larger than film thickness of any other portion.

6. The device according to claim 1, wherein the inter-electrode dielectric film comprises at least a three-layered structure of a first inter-electrode dielectric film provided while covering a surface of the first gate electrode, a second inter-electrode dielectric film provided while covering a surface of the first inter-electrode dielectric film, and a third inter-electrode dielectric film provided while covering a surface of the second inter-electrode dielectric film.

7. The device according to claim 6, wherein the second inter-electrode dielectric film is formed such that film thickness of a portion provided on a top face of the first gate electrode is smaller than film thickness of a portion provided on a side face of the first gate electrode.

8. The device according to claim 6, wherein the second inter-electrode dielectric film is formed such that film thickness of a portion covering the corner portion that does not come into contact with the gate dielectric film of the first gate electrode on a top face of the first gate electrode is smaller than film thickness of a portion covering the corner portion that does not come into contact with the gate dielectric film of the first gate electrode on a side face of the first gate electrode.

9. The device according to claim 6, wherein, among the second inter-electrode dielectric film, at least film thickness of a portion provided on a side face of the first gate electrode is formed to be larger than film thickness of each of the first inter-electrode dielectric film and the second inter-electrode dielectric film.

10. The device according to claim 6, wherein the second inter-electrode dielectric film is formed such that film thickness of a portion covering the corner portion that does not come into contact with the gate dielectric film of the first gate electrode is larger than film thickness of any other portion.

11. The device according to claim 1, wherein the inter-electrode dielectric film comprises at least a three-layered structure of a first inter-electrode dielectric film provided while covering a surface of the first gate electrode, a second inter-electrode dielectric film provided on a surface of the first inter-electrode dielectric film on a side face of the first gate electrode, and a third inter-electrode dielectric film provided while covering a surface of the second inter-electrode dielectric film and a surface of the first inter-electrode dielectric film.

12. The device according to claim 11, wherein the corner portion that does not come into contact with the gate dielectric film of the first gate electrode is covered with each of the inter-electrode dielectric films of three layers made of first, second, and third layers on a side face of the first gate electrode and is covered with the inter-electrode dielectric films of two layers made of first and second layers on a top face of the first gate electrode.

13. The device according to claim 1, wherein the inter-electrode dielectric film comprises at least a three-layered structure of a first inter-electrode dielectric film provided while covering a surface of the first gate electrode, a second inter-electrode dielectric film provided on a surface of the first inter-electrode dielectric film while covering the corner portion that does not come into contact with at least the gate dielectric film of the first gate electrode, and a third inter-electrode dielectric film provided while covering a surface of the second inter-electrode dielectric film and a surface of the first inter-electrode dielectric film.

14. The device according to claim 13, wherein the second inter-electrode dielectric film is provided on a surface of the first inter-electrode dielectric film except for a portion excluding the corner portion that does not come into contact with the gate dielectric film of the first gate electrode among a top face of the first gate electrode.

15. The device according to claim 13, further comprising:
    an element isolation area provided adjacent to a side face of the first gate electrode while exposing at least a upper portion of the side face of the first gate electrode,
    wherein the second inter-electrode dielectric film is provided on a surface of the first inter-electrode dielectric film while covering a top face of the element isolation area and the corner portion that does not come into contact with the gate dielectric film of the first gate electrode.

16. The device according to claim 15, wherein the inter-electrode dielectric film is formed such that film thickness of a portion provided while covering the corner portion that does not come into contact with the gate dielectric film of the first gate electrode and film thickness of a portion provided on the top face of the element isolation area each are larger than film thickness of any other portion.

17. The device according to claim 1, wherein film thickness of at least a portion of the inter-electrode dielectric film covering the corner portion that does not come into contact with the gate dielectric film of the first gate electrode is set at a thickness larger by 1.2 times or more than film thickness of at least another portion.

18. The device according to claim 1, wherein the inter-electrode dielectric film comprises a three-layered structure of a first inter-electrode dielectric film provided while covering a surface of the first gate electrode, a third inter-electrode dielectric film provided while covering a surface of the second gate electrode at a side opposite to the first gate electrode, and a second inter-electrode dielectric film provided after being partially or fully sandwiched between the third inter-electrode dielectric film and the first inter-electrode dielectric film, and each of the first, second, and third inter-electrode dielectric films is formed using at least one of an oxide, a nitride, and a high dielectric constant material of which dielectric constant is equal to or larger than 9.

19. A method for manufacturing a semiconductor device, comprising:

providing a gate dielectric film on at least one site on a surface of a semiconductor substrate;

providing at least one first gate electrode on the gate dielectric film;

providing an inter-electrode dielectric film while covering a surface of the first gate electrode such that film thickness of at least part of a portion covering a portion other than a corner portion that does not come into contact with the gate dielectric film among a plurality of corner portions of the first gate electrode is made smaller than film thickness of at least part of a portion covering the corner portion that does not come into contact with the gate dielectric film; and providing a second gate electrode while covering a surface of the inter-electrode dielectric film.

20. The method according to claim 19, wherein a first inter-electrode dielectric film is provided while covering a surface of the first gate electrode, a second inter-electrode dielectric film is provided above part of the corner portion that does not come into contact with at least the gate dielectric film of the first gate electrode, among a surface of the first inter-electrode dielectric film, and a third inter-electrode dielectric film is provided while covering at least a surface of the second inter-electrode dielectric film, thereby forming the inter-electrode dielectric film at least in a three-layered structure.

* * * * *